(12) United States Patent
Hughes

(10) Patent No.: US 6,668,164 B2
(45) Date of Patent: Dec. 23, 2003

(54) METHOD AND APPARATUS FOR REDUCING INTERMODULATION DISTORTION IN A LOW CURRENT DRAIN AUTOMATIC GAIN CONTROL SYSTEM

(75) Inventor: James David Hughes, Boynton Beach, FL (US)

(73) Assignee: Motorola, Inc., Schaumburg, IL (US)

( * ) Notice: Subject to any disclaimer, the term of this patent is extended or adjusted under 35 U.S.C. 154(b) by 551 days.

(21) Appl. No.: 09/738,696

(22) Filed: Dec. 15, 2000

(65) Prior Publication Data

US 2003/0207674 A1 Nov. 6, 2003

Related U.S. Application Data

(60) Provisional application No. 60/208,513, filed on Jun. 1, 2000.

(51) Int. Cl.[7] .............................. H04B 1/06; H04B 7/00
(52) U.S. Cl. ..................... 455/234.1; 455/295; 330/278
(58) Field of Search ........................... 455/232.1, 234.1, 455/234.2, 250.1, 295, 296; 330/278, 291

(56) References Cited

U.S. PATENT DOCUMENTS 6,218,899 B1 * 4/2001 Ezell ........................... 330/254
6,271,726 B1 * 8/2001 Fransis et al. .............. 330/254
6,487,419 B1 * 11/2002 Freed .......................... 455/522

* cited by examiner

Primary Examiner—Nguyen T. Vo
(74) Attorney, Agent, or Firm—Randi L. Du Laney

(57) ABSTRACT

An apparatus for reducing intermodulation distortion in a low current drain automatic gain control system includes a multiplier (1500) and an AGC digital signal processor (1100).

13 Claims, 18 Drawing Sheets

| STORAGE LOCATION | GAIN | VALUE ADJUSTMENT |
|---|---|---|
| 0 | MAX GAIN | $0_7 - 0_0$ |
| 1 | $-3dB$ | $X_{1,1}X_{1,0}$ |
| 2 | $-6dB$ | $X_{2,1}X_{2,0}$ |
| 3 | $-9dB$ | $X_{3,1}X_{3,0}$ |
| 4 | $-12dB$ | $X_{4,1}X_{4,0}$ |
| 5 | $-15dB$ | $X_{5,1}X_{5,0}$ |
| 6 | $-18dB$ | $X_{6,1}X_{6,0}$ |
| 7 | $-21dB$ | $X_{7,1}X_{7,0}$ |
| 8 | $-24dB$ | $X_{8,1}X_{8,0}$ |
| 9 | $-27dB$ | $X_{9,1}X_{9,0}$ |
| 10 | $-30dB$ | $X_{10,1}X_{10,0}$ |
| ⋮ | ⋮ | |
| 19 | $-57dB$ | $X_{19,1}X_{19,0}$ |

POINTER → 5

*FIG. 3*

| STORAGE LOCATION | GAIN | VALUE ADJUSTMENT |
|---|---|---|
| N | GAIN | $0_7 - 0_0$ |
| 0 | MAX GAIN | $0_7 - 0_0$ |
| 1 | $-3dB$ | $X_{1,1} X_{1,0}$ |
| 2 | $-6dB$ | $X_{2,1} X_{2,0}$ |
| 3 | $-9dB$ | $X_{3,1} X_{3,0}$ |
| 4 | $-12dB$ | $X_{4,1} X_{4,0}$ |
| 5 | $-15dB$ | $X_{5,1} X_{5,0}$ |
| 6 | $-18dB$ | $X_{6,1} X_{6,0}$ |
| 7 | $-21dB$ | $X_{7,1} X_{7,0}$ |
| 8 | $-24dB$ | $X_{8,1} X_{8,0}$ |
| 9 | $-27dB$ | 0 |
| 10 | $-30dB$ | 0 |
| ⋮ | ⋮ | |
| 17 | $-51dB$ | 0 |
| 18 | $-54dB$ | 0 |
| 19 | $-57dB$ | 0 |

POINTER → 5

*FIG. 26*

METHOD AND APPARATUS FOR REDUCING INTERMODULATION DISTORTION IN A LOW CURRENT DRAIN AUTOMATIC GAIN CONTROL SYSTEM

This application claims the benefit of provisional application No. 60/208,513 filed Jun. 1, 2000.

FIELD OF THE INVENTION

This invention relates in general to wireless communication systems, and more specifically to a method for reducing intermodulation distortion in a radio receiver.

BACKGROUND OF THE INVENTION

A mobile radio in the field will find that the modern environment for the reception of radio signals requires very aggressive performance standards. This is because of a number of factors. The large number of devices transmitting simultaneously in the field today causes interference. The desire to keep infrastructure costs down, and thus mobile range high, requires large dynamic range radios. The growth of superstructures (such as buildings) which block and reflect signals causing fading and simulcasting radio patterns. Extending battery life of a portable, or mobile, radio can only be accomplished through keeping power consumption down.

For simplicity, a mobile radio generally consists of an antenna followed by: a step attenuator, a low noise amplifier (LNA), down conversion mixers, digital to analog conversion, channel filtering, an input to an AGC, and other digital signal processing for the purpose of demodulating and interpreting the signals.

The signal enters the radio through the antenna and the strength of this signal can vary over 120 decibels in some applications. The demodulator in the back end of the radio cannot deal with large variation in signals. In order to deal with the wide dynamic range requirements and fading signals, radios are designed with automatic gain control (AGC). The automatic gain control takes the form of a negative feedback loop wrapped from the power monitoring point in the rear of the radio to the front end gain stage of the radio. The front gain stage of the radio consists of the low noise amplifier (LNA) and step attenuator under control of the AGC controller. The automatic gain control (AGC) monitors the power of the signal received at the back end of the radio. The signal power is measured against a predefined threshold. The desire is to maintain the signal at this power level (specified by this threshold) to correctly demodulate and interpret the data. If the signal is below the threshold, the AGC will want to raise the gain of the front end of the radio (LNA). If the signal is above the threshold, the AGC will want to lower the gain of the front end of the radio. If the signal is too low, the AGC will shift all the way to maximum gain mode. If the signal is too high, the AGC will shift all the way to a minimum gain mode.

In order for mobile radios, to operate with longer battery life, it is necessary to lower the current consumption of radio stages. Traditionally the low noise amplifier (LNA) in the front of the radio is the dominate current drain stage. To significantly lower the current drain of that stage would dramatically reduce the current drain of the entire radio and substantially improve battery life. Extremely, low current design LNAs however present another problem to the radio design: non-linearity.

The linearity of the LNA is important because unwanted signals entering the antenna can mix into the passband of the radio. An unwanted signal in the passband will interfere with the demodulation process and not allow the radio to interrupt the data correctly. This type of interference is called intermodulation. A measure of the linearity of a LNA is called the third order intercept point (IP3). A low noise amplifier with a higher IP3 performance is more linear and creates less interfering component in the pass band of the radio. Traditionally, LNA designs have run at higher current levels because they wanted to maintain this high linearity performance. These products, of course, had larger batteries to compensate. In today's radios which seek extremely low power, the LNA can develop problems with linearity. Specifically in a paging radio, or selective call receiver, or pager, the LNA design runs at five times less current than traditional LNA designs of those skilled in the art. This very low current design, although great for improving the battery life of the product, has a peaking response in the intercept point performance (IP3) over the gain range of operation of the amplifier. Over the entire gain range of operation of the amplifier (from minimum to maximum gain) the IP3 performance peaks in the middle of the operation range. During this peak, the IP3 and thus the intermodulation performance of the radio, is great. But to either side of the peak the intermodulation performance drops greatly, typically below specifications.

The peak in the IP3 performance leads to another problem in a traditional closed loop negative feedback AGC system. The peaked IP3 response will force the AGC to lock to the minimum gain condition where the intermodulation performance is the worse and the data being transmitted would be lost. For example, if the radio is placed in a strong signal environment with other channels present to create intermodulation products in the passband. The AGC system averages the power of both the wanted and the unwanted intermodulation (IM) components in the passband. In a strong signal scenario at the input to the antenna, the AGC system will want to turn the gain down. As the gain gets cut back from maximum toward minimum, the radio moves toward the peak in the LNA IP3 performance. At the peak, the IM product reduces in the passband because this is the most linear operation point of the amplifier. If the power out of the back end of the radio is still strong enough to be above the AGC threshold, the AGC system will want to continue to reduce the gain. Now the radio is moving off the peak of the LNA IP3 curve and IM product in the passband starts to increase even though the wanted signal is decreasing because the over all gain of the LNA is being lowered. Because the IM product in the passband is increasing the AGC system measures its power and continues to want to reduce the gain. (The AGC power detector measures the power in the complete passband of the radio.) The radio will continue to reduce gain until it hits its minimum value. This is a detriment to the radio because now the IM component is stronger than the wanted component in the pass band and the data to be received is lost.

Thus, what is needed is a method of reducing intermodulation distortion in a low current drain automatic gain control system, and more particularly, a method and apparatus of overcoming the problem with peaked IP3 response and AGC locking at an incorrect gain.

BRIEF DESCRIPTION OF THE DRAWINGS

FIG. 3 a diagrammatic representation of the storage of a low noise amplifier (LNA) gain response curve, as stored in AGC calibration registers.

FIG. 26 is a diagrammatic representation of the storage of an optimum LNA gain response curve, corresponding to a peak of the IP3 curve.

DESCRIPTION OF A PREFERRED EMBODIMENT

Figure 1:
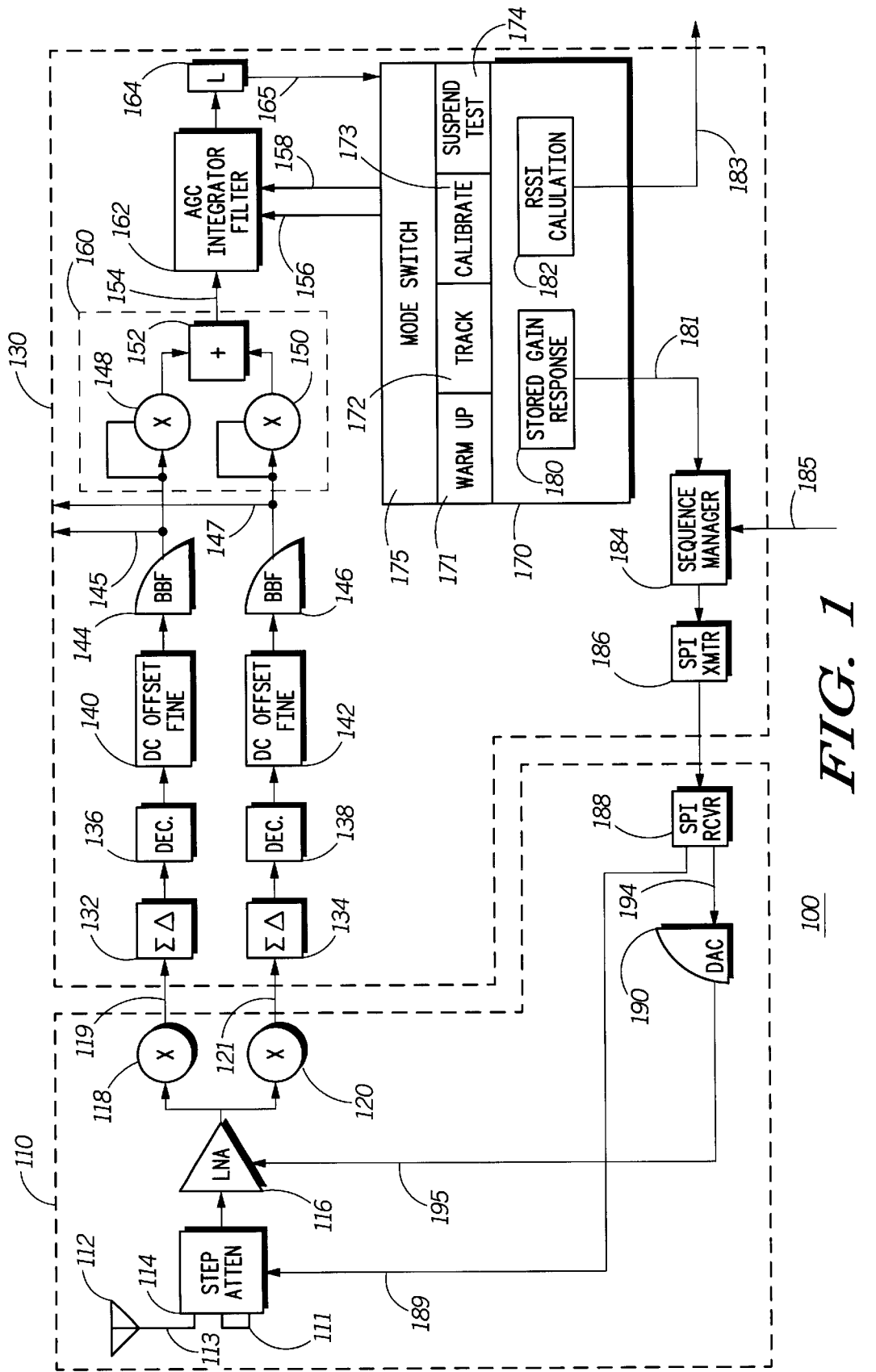
FIG. 1 is a block diagram of a radio system with automatic gain control (AGC), in accordance with the preferred embodiment of the invention.
Figure 11:
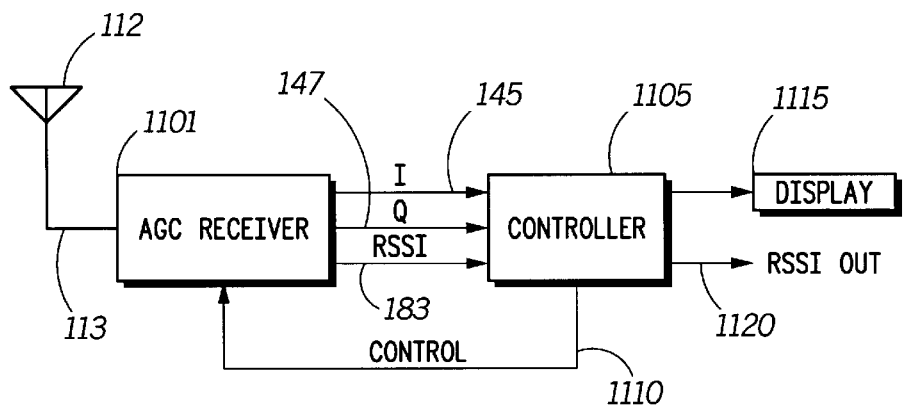
FIG. 11 is a simplified block diagram of a complete messaging unit, or radio.

Referring to FIG. 1, an electrical block diagram shows an automatic gain control (AGC) system 100 portion of a ZIF receiver, in accordance with a preferred embodiment of the present invention. The AGC system 100 is a portion of an AGC receiver 1101 (see FIG. 11) of a radio 1100 (FIG. 11), and comprises a radio frequency (RF) front end 110 that intercepts an RF signal using antenna 112. The AGC receiver 1101, which is a zero IF receiver in the preferred embodiment of the present invention, attenuates the intercepted signal 113 in a step attenuator 114 according to an attenuator control signal 189; amplifies the RF signal in a low noise amplifier (LNA) 116; and converts the amplified RF signal within two mixers 118, 120 to an unfiltered in-phase (I) signal 119 and a quadrature phase (Q) unfiltered signal 121. The LNA 116 is controlled by a gain control signal 195 that is conveyed to the LNA 116 as an analog signal. The embodiments of the present invention described and claimed herein are optimized for a radio used in a communication system having a synchronous signaling protocol that has well defined signaling cycles consisting of a normal data portion preceded by a preamble portion, such as used in paging and cellular radio systems. The preamble portion has a predetermined duration that comprises synchronizing patterns such as included in the symbol, word, frame start, and bit rate patterns, but aspects of the present invention are also applicable for ZIF radio receivers and conversion type receivers (for example, single and dual conversion receivers) used in other types of communication systems having similar well defined cycles. The example of such a synchronous communication system used herein is the well known FLEX® signaling protocol, in which the cycles are called frames. The unfiltered I and Q signals 119, 121 are coupled to a back end 130 of the AGC receiver 1101 (FIG. 11). The back end 130 samples the unfiltered I and Q signals 119, 121 by a pair of sigma-delta converters 132, 134. The sampled I and Q signals are then decimated and filtered by a pair of decimation functions 136, 138. The decimated I and Q signals are DC offset corrected in DC offset fine control functions 140, 142, and filtered by base band filters (BBFs) 144, 146. The filtered I signal 145 and filtered Q signal 147 generated by the DC offset fine control functions 140, 142 are coupled to other portions of the back end 130 and coupled to a controller function 1105 of the radio 1100 (see FIG. 11), wherein the information in the radio signal is decoded and processed, in a conventional manner, and coupled to a symbol clock 185 that is synchronized to symbols of the protocol (also called protocol symbols) conveying the information.

The filtered I and Q signals 145, 147 generated by the BBFs 144, 146 are also coupled to inputs of two squaring functions 148, 150 of a magnitude generator 160 that also comprises an adder function 152 that adds together the outputs of squaring functions 148, 150. An output signal 154 of the adder function 152 which is also the output signal 154 of magnitude generator 160 and is named a binary voltage squared signal, is coupled to an AGC filter 162. The output of the AGC filter 162 is buffered in latch (L) 164. The latch 164 holds the binary voltage squared signal, which has been filtered and delayed, and couples the binary voltage squared signal 165 to a gain corrector 170. The AGC filter is controlled by two signals, a bandwidth signal 156 and a symbol rate signal 158 generated by the gain corrector 170. It will be appreciated that the outputs of the magnitude generator 160, the AGC filter 162, and latch 164 are binary values that represent scaled units of voltage squared, and therefore they are scaled values that represent a recovered signal strength, or recovered signal power, of the intercepted signal 113. Furthermore, the binary values are based on the power of the RF signal 113 that has been intercepted by the antenna 112, either attenuated or passed through the step attenuator 114 according to the attenuator control signal 189, modified by (attenuated, passed through, or amplified) the LNA 116 according to the gain control signal 195, and modified by a fixed gain (or loss) of the back end functional chain comprising the sigma-delta converters 132, 134, the decimation functions 136, 138, the DC offset fine control functions 140, 142, and the base band filters 144, 146, thereby resulting in the recovered signal 154, 165.

The low noise amplifier 116 is designed using conventional techniques to have a gain versus gain control value curve that is approximately logarithmic over a wide range, as will be discussed below with reference to FIG. 13. However, in order to keep the cost of producing the LNA 116 low, it is only somewhat logarithmic over the wide range, and hence is properly described as a non-logarithmic amplifier.

The gain corrector 170 comprises a mode switch 175 that has four modes: warm up 171, track 172, calibrate 173, and suspend test 174. The gain corrector 170 generates two outputs: a combined signal 181 and a received signal strength indicator (RSSI) signal 183. The combined signal 181 is coupled to a serial port interface (SPI) transmitter 186 through a sequence manager 184. The SPI transmitter 186 couples the combined signal 181 to SPI receiver 188, which couples a gain control value 194 conveyed in the combined signal 181 as a binary "word" of information to a digital to analog converter (DAC) input of the LNA 116, and couples an attenuator control signal 189 conveyed in the combined signal 181 as a binary state to step attenuator 114. The gain control value 194 is preferably 7 bits wide so that the combined signal 181 can be conveyed in a byte, but it will be appreciated that the gain control value 194 "word" can have other binary widths. The gain corrector 170 also comprises a stored gain response 180 from which the gain control value 194 is generated, and an RSSI function 182 that generates the RSSI signal 183. The gain corrector 170 generates the gain control value 194 such that the gain of the LNA 116 changes in an essentially accurate logarithmic manner with reference to changes in value of the gain control value 194.

In accordance with the preferred embodiment of the present invention, the sampling functions (described above), the sigma-delta converters 132, 134, the decimation functions 136, 138, the DC offset fine control functions 140, 142, and the base band filters 144, 146 are implemented as digital functions in a conventional processor such as a digital signal processor (DSP), but it will be appreciated that these functions could be alternatively performed by analog circuits or digital logic implemented as a portion of a custom integrated circuit (IC) state machine. The magnitude generator 160 is implemented as digital logic implemented as a portion of a state machine IC, but is alternatively performed by a processor, such as a DSP. The squaring functions 148, 150 are preferably implemented in a unique manner as described below, but is alternatively performed by any technique that provides a square of a measured voltage value to a predetermined level of precision, such as by a memory table implemented as a portion of an IC state machine, or by conventional multiplication performed in a processor. The adder function 152, the AGC filter 162 and the latch 164 are conventional functions that are preferably implemented using digital logic that is a portion of the custom IC state machine, but is alternatively implemented using a conventional processor or using a digital signal processor (DSP) using unique sets of program instructions stored in read only memory (ROM). The gain corrector 170, which incorporates several of the unique functions described herein, is also preferably implemented using digital logic that is a portion of the custom IC state machine, but it will be appreciated the functions could alternatively be implemented using a conventional processor or using a DSP using unique sets of program instructions stored in ROM. The modes of the mode switch 175, the stored gain response 180, and the RSSI function 182 are unique functions described in more detail below.

The sequence manager 184 is a unique function that couples new gain control value words through the SPI transmitter and receiver 186, 188 and the DAC 190 to the LNA 116 only during the occurrences of edges of the protocol symbols that pass through the LNA 116. The sequence manager 184 compensates for fixed and varying delays in the AGC loop 100, so that new a gain control signal 195 is coupled to the LNA 116 at a next protocol symbol edge occurring within the LNA 116 within a small fraction of a symbol duration. The timing of the edges of the protocol symbols is inherently different at different stages of the front and back ends 110, 130 of the AGC receiver 1101 due to delays inherent in the stages of the AGC receiver 1101, and the timing of the edges changes with changes in the bandwidth of the AGC system 100 (also called herein the "loop bandwidth", or the "AGC bandwidth") and with changes in the duration of the symbols. The SPI transfer occurs very quickly with reference to the duration of the symbol clock periods. This unique aspect of coupling the gain control values to the LNA 116 only at the protocol symbol edges within the LNA 116 helps to reduce digital switching noise in the AGC receiver 1101 front end during the center of the symbol period. Also, when a symbol clock edge occurs and the gain corrector 170 senses that the gain of the LNA 116 is still in the correct position (i.e., the RF signal has not changed significantly, and the gain control value 194 does not need to be updated), a gain control value 194 is not coupled to the SPI transmitter, to help reduce digital noise The AGC system 100 described herein regulates the gain of the front end 110 to protect the radio 1100 from an overload condition. The AGC system 100 facilitates the successful operation of the radio 1100 over 115 dB of dynamic range. The AGC system 100 is also key in helping the AGC receiver 1101 to achieve excellent intermodulation and adjacent channel specifications. The RSSI signal 183 allows the host processor to poll and check a measure of channel strength for conventional purposes such as handoff decisions and transmit power adjustments, and to achieve precise tuning of the AGC receiver 1101.

The gain corrector 170 uses the voltage squared value that represents the recovered signal power, for all calculations involving the recovered signal power, and by doing so, is able to work in +/−3 dB increments by simply right or left shifting the value (and inserting zeroes in the least significant bit position when shifting left), because such shifting either halves or doubles the value representing the power level, which is very close to +/−3 dB changes.

This technique of manipulating input power values in +/−3 dB increments with binary shifts is key to simplifying the calculations in the AGC system 100, as opposed to prior art approaches which use fixed point multiplies and divides, and greatly reduces the circuitry (and/or memory requirements) and the power used by the AGC system 100.

The AGC system 100 is a negative feedback circuit, and thus it can suffer from loop dynamics such as instability, overshoot and undershoot. To minimize this, once the gain corrector 170 updates the LNA 116 with a changed gain control signal 195 (by updating the gain control value 194) and/or with an attenuator control signal 189 change, gain corrector 170 waits for approximately two symbol periods at 6400 baud (two symbol periods have a duration of 625 microseconds (usec.)) before calculating a new gain control value 194. During this wait state, the AGC filter 162 is cleared and kept reset. This reset state, or delay, allows any perturbation of the signal caused by the last AGC update to propagate through the system. In the preferred embodiment of the present invention, the propagation delay from the LNA 116 to the latch 164 is approximately 450 usec. The reset state ensures that the next new measurement cycle for the gain corrector 170 will be based on clean data and the AGC system 100 remains stable. Because the propagation delay is essentially independent of the symbol rate, the reset state is kept at approximately 625 usec for symbol rates other than 6400 baud. This reset state allows the AGC bandwidth to be faster than prior art AGC systems. (Typically, the AGC system in accordance with the invention can easily operate at a 400 Hz bandwidth which is twice as fast as prior art products). This is valuable because, traditionally, AGC bandwidths of a ZIF receiver are low due to inherent injected transients such as LNA gain induced DC offsets. Former AGC designs do not typically clear the loop filter. They allow the transients to be integrated by the loop and therefore take even longer to clear disturbances from the AGC system. The AGC wait delay can be modified to fit other systemic propagation delays.

In accordance with the preferred embodiment of the present invention, the RF step attenuator 114 is digitally controlled by the gain corrector 170, and has two states: an attenuation state in which it provides approximately 17 dB of attenuation and a pass-through, or non-attenuation, state in which the signal is neither attenuated or amplified significantly. A decision whether to use the attenuation state of the step attenuator 114 is made near the beginning of a frame of the FLEX protocol. The radio 1100 starts the warm up mode 171 with the step attenuator 114 in the attenuation state. A determination is made by the gain correction function 170 during the warm up mode 171 whether to switch to the non-attenuated state. After the radio 1100 changes to the track mode 172, which occurs during normal data receive operations, the step attenuator 114 is switched to the non-attenuated state only when the recovered signal power drops below a predetermined AGC Step-Out Threshold. Following such a switch to the non-attenuated state, the step attenuator 114 is not switched back to the attenuated state during the same frame. This feature stops the step attenuator 114 from being switched from the non-attenuated to the attenuated state, and back, during a frame. This improves the performance of the radio 1100 because the step attenuator 114 can cause large perturbations on top of the wanted signal when it is switched, and repeated switching could lead to desensitization of the AGC receiver 1101. In most cases, the variable gain of the LNA 116 can be set low enough to handle reasonably large signals when the step attenuator 114 is switched to the non-attenuation state. The step attenuator 114 is most useful when the AGC receiver 1101 is in very strong intermodulation (IM) or adjacent channel signaling environments, which will typically last for at least a majority of a frame.

The present invention has three threshold values: AGC Tracking threshold (AGC_THRES), AGC Step Out threshold (AGC_THRESSO, and AGC Warm Up threshold (AGC_THRESWU). The units of each threshold are volts squared.

The AGC Tracking threshold is set 16 dB to 20 dB above a signaling sense floor. The AGC Tracking threshold is the recovered signal power to which the AGC system 100 regulates during the track mode by controlling the gain of the LNA 116 by means of the gain control value 194, when the recovered signal power is greater than the AGC Tracking threshold. When the recovered signal power is less than the AGC Tracking threshold, the gain corrector 170 keeps the LNA 116 at a maximum gain. The AGC Step Out threshold is preferably set 12 dB above the signaling sense floor. When the step attenuator 114 is in the attenuated state and the LNA 116 is at the maximum gain, the AGC Step Out threshold is used to determine whether to switch the step attenuator 114 to the non-attenuated state. The AGC Warm Up threshold is preferably set 45 dB above the signaling sense floor. This threshold is used during the warm up mode to meet IM specifications, as described in more detail below. The AGC system 100 uses a default hysteresis of +/−3 dB above and below each of the three thresholds. This hysteresis can be increased to +/−6 dB by appropriate programming.

Warm Up Mode

Figure 2:
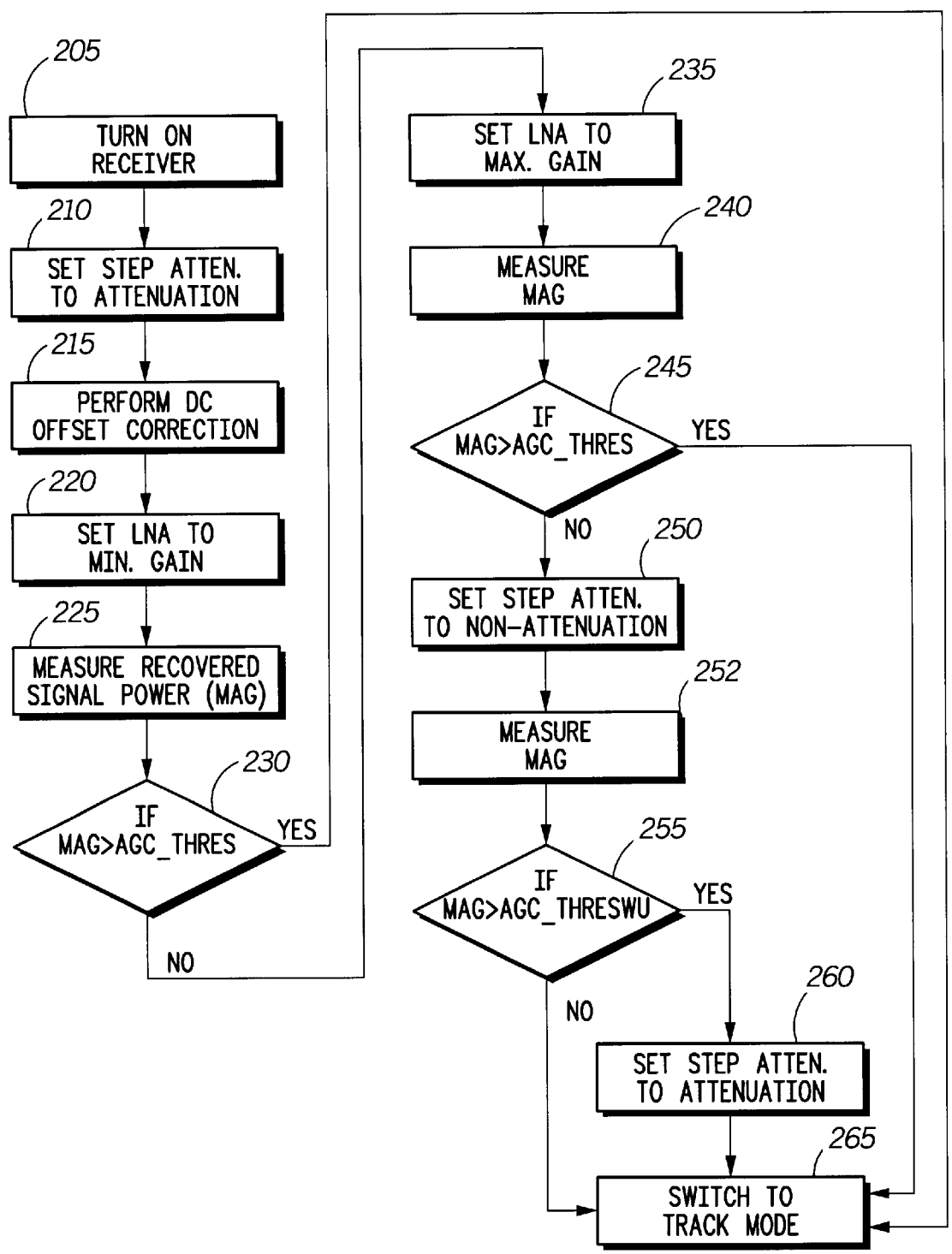
FIG. 2 is a flow diagram of an AGC warm-up mode sequence with step attenuation decision.

Referring now to FIG. 2, a flow chart of the warm up mode 171 operation of the gain corrector 170 is shown, in accordance with the preferred embodiment of the present invention. The warm up mode 171 is used, when the radio 1100 (FIG. 11) is operating synchronously with the synchronous signaling protocol, to make a decision as to whether to use step attenuator 114 in the attenuate mode during the track mode 172. (An asynchronous warm up mode, not described herein, is used when the radio 1100 is first turned on). The warm up mode 171 is normally timed to begin near the beginning of the preamble of a FLEX frame, after the radio 1100 has been operating in a communication system long enough to have established synchronism with the frame periods. At step 205, the radio 1100 turns on the AGC receiver 1101 to begin receiving a frame of information. It will be appreciated that in FLEX communication systems and in other similar systems, when the radio 1100 is operating in the synchronous mode, the AGC receiver 1101 is kept in a "receiver-off" mode during one or more frames, or cycles, in which the radio 1100 expects to receive no pertinent new information (but the radio 1100 remains essentially synchronous with the synchronous signaling protocol). When the AGC receiver 1101 is powered on at step 205, the gain control value 194 is at a Lowest Gain, having been set to the Lowest Gain at the time of power down of the AGC receiver 1101. In accordance with the preferred embodiment of the present invention, this Lowest Gain is a setting that is lower than a Minimum gain control value that is used during normal adjustments of the LNA 116 during the Track Mode 172. The Lowest Gain is achieved by essentially shutting off the LNA 116. At step 210, the step attenuator 114 is set to the attenuation state. At step 215, DC offset correction is performed, which lasts 625 usec. At step 220, the gain control value is then set to the Minimum gain control value. At step 225, the recovered signal power, having a binary value, MAG, of the binary voltage squared signal 165, is determined during a measurement period starting 650 usec after the DC offset correction is completed, and lasting 1.250 milliseconds. The binary voltage squared signal 165 is also referred to as a first amplitude recovered signal with these settings of the step attenuator 114 and LNA 116. A comparison of MAG (of the first amplitude recovered signal) to the AGC_THRES is made at step 230. When MAG is greater than AGC_THRES, the step attenuator 114 is left in the attenuation state and the AGC system 100 is changed to the track mode 172, at step 265. In an example of a VHF receiver embodiment of the present invention, the intercepted signal power is greater than −21 dBm (decibels referenced to 1 milliwatt) when MAG is greater than AGC_THRES under these settings. When MAG is less than or equal to AGC_THRES, the LNA 116 is set to a Maximum gain at step 235 and the recovered signal power, MAG, which will typically have been increased by the increased gain of the LNA 116 is again determined, this time during a measurement period starting 650 usec after the LNA 116 gain is changed, and lasting 1.250 milliseconds, at step 240. The binary voltage squared signal 165 is referred to as a second amplitude recovered signal with these settings of the step attenuator 114 and LNA 116. At step 245, when MAG (of the second amplitude recovered signal) is greater than AGC_THRES, the step attenuator 114 is left in the attenuation state and the AGC system 100 is changed to the track mode 172, at step 265. In the example of the VHF receiver, the intercepted signal power is greater than −62.5 dBm when MAG is greater than AGC_THRES under these settings. When MAG is less than or equal to AGC_THRES, the step attenuator 114 is set to the non-attenuation state at step 250 and the recovered signal power, MAG, which will typically have been increased by the reduced attenuation of the step attenuator 114 is again determined, this time during a measurement period starting 650 usec after the step attenuator 114 setting is changed, and lasting 1.250 milliseconds, at step 252. The binary voltage squared signal 165 is referred to as a third amplitude recovered signal with these settings of the step attenuator 114 and LNA 116. When MAG (of the third amplitude recovered signal) is greater than AGC_THRESWU at step 255, the step attenuator 114 is reset to the attenuation state and the AGC system 100 is changed to the track mode 172, at step 265. In the example of the VHF receiver, the intercepted signal power is greater than −79.5 dBm when MAG is greater than AGC_THRES under these settings. When MAG is less than or equal to AGC_THRESWU at step 255, the step attenuator 114 is left in the non-attenuation state and the AGC system 100 is changed to the track mode 172, at step 265. By these decisions, it can be seen that the step attenuator 114 is set to one of the attenuation state and the pass through state by the commencement of the normal data portion of the received signal.

Track Mode

Referring now to FIG. 3, a map of a set of registers that hold the stored gain response 180 is shown, in accordance with the preferred embodiment of the present invention. The set of registers is preferably implemented as a plurality of register storage locations specifically designed for the purpose of holding the stored gain response 180. At each of a predetermined number of storage locations, identified as locations 0 to 19 in the example shown in FIG. 3, there is a set of VALUE ADJUSTMENT registers for storing a gain control value adjustment. A predetermined maximum gain control value (identified in FIG. 3 as $O_7-O_0$), which in this example is 31, is the value adjustment associated with storage location 0. The other value adjustments are measured and stored during the calibrate mode 173 using a conducted RF signal of fixed power that is coupled to a conducted input 111 (FIG. 1). (Use of the conductive input 111 switches off the intercepted signal 113 from the antenna 112 at the step attenuator 114.) Each location is associated with a gain that is very close to being 3 dB lower in value from a gain associated with a next higher ordinal location. Thus, the locations have gains associated with them as shown in the GAIN column of FIG. 3 (but the GAINS are not stored). Each value adjustment stored at the locations other than 0 is a value adjustment that represents the approximate change in the gain control value 194 that is needed to change from the gain of LNA 116 at the lower location to the gain of LNA 116 associated with the next adjacent location. It will be appreciated that a gain control value 194 at a particular location for a particular relative gain is derived from the maximum gain control value and the value adjustments for the locations up to, and including, the particular location. The gain control value 194 so derived, when applied to the LNA 116 by the gain control signal 194 generated by the DAC 190, provides essentially the same gain reduction from the maximum gain at location 0 as achieved during the calibrate mode 173. However, it should be appreciated that the absolute binary value of the binary voltage squared signal 165 at a particular gain control value may be different in the track mode 172 than in the calibrate mode 173 because the power of the intercepted signal 113 in the track mode 172 can be, and typically will be, different than the power of the conducted RF signal used for the calibrate mode 173. Importantly, it will be appreciated that the gain control value 194 can be adjusted by subtracting or adding, respectively, the value adjustment associated with a next higher or lower location, resulting in a plus or minus 3 dB change in the power of the recovered signal 165. A pointer register holds a current value of a location that is associated with a gain that is set by a present value of the gain control value 194 that has been determined from the value adjustments associated with all the locations between 0 and the location being pointed to. It will be appreciated that the stored gain response is preferably a dedicated set of registers, but could alternatively be any other type of memory such as a portion of processor registers or other memory such as random access memory (RAM), in which case the pointer value is added to a base address in a conventional manner to recover the gain and value adjustment. It will also be appreciated that the use of value adjustments reduces the amount of storage necessary to regenerate a gain control value, in comparison to storing the absolute gain control value for each desired relative gain. In accordance with the preferred embodiment of the present invention, the value adjustments are stored in two bits for each storage location. For example, the two bits associated with storage location 5, where the pointer is shown pointing, are identified as X5,1 and X5,0.

Figure 4:
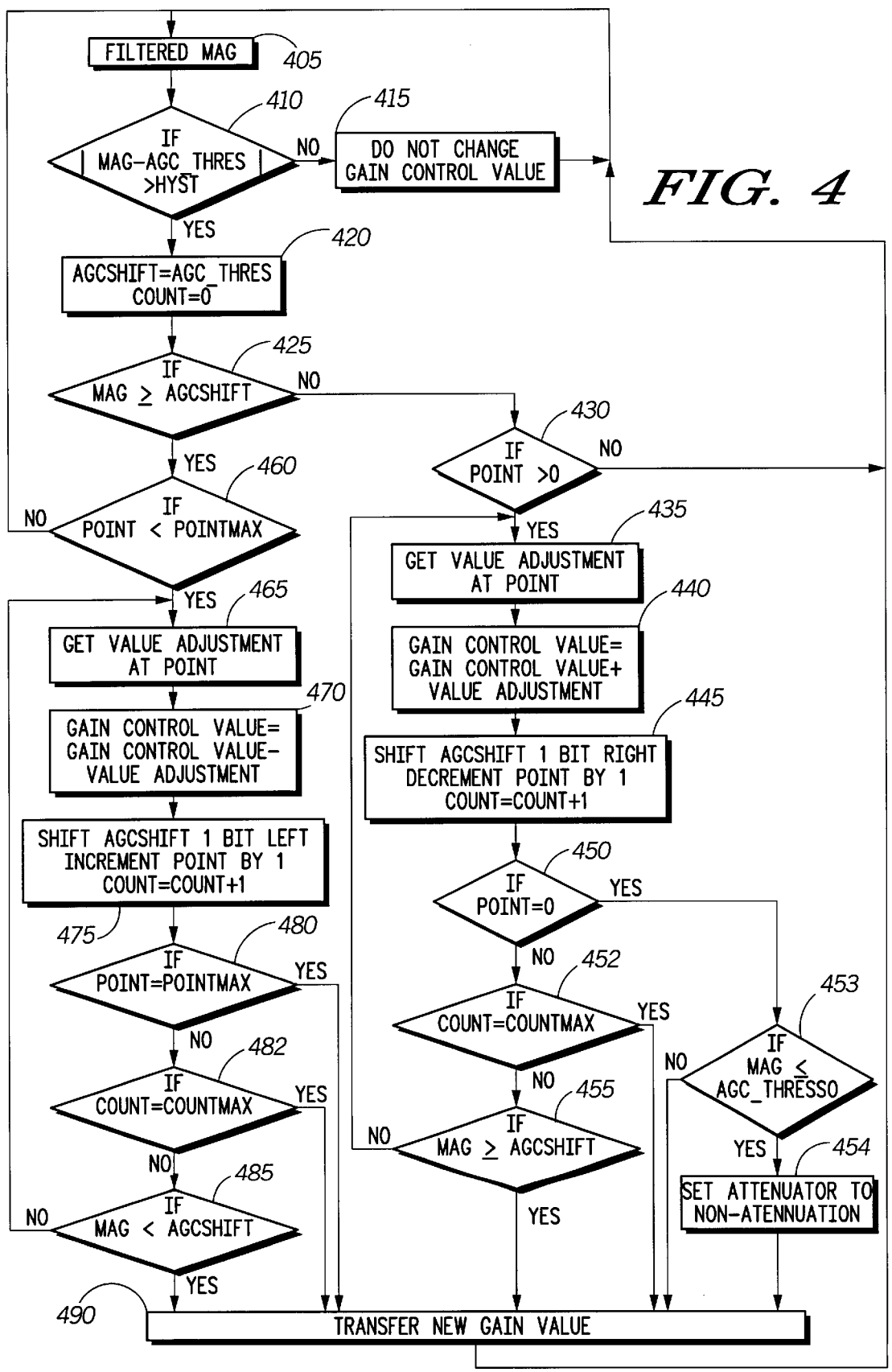
FIG. 4 is a flow diagram of an AGC track mode sequence.

Referring to FIG. 4, a flow chart of the track mode 172 is shown in accordance with the preferred embodiment of the present invention. At step 405, the binary value, MAG, of the filtered binary voltage squared signal 165 is acquired and tested at step 410 to determine whether it differs from AGC_THRES by more than a predetermined hysteresis, HYST, which is preferably 3 dB. If it is not, then no change is made in the gain control value at step 415, and the process awaits the next measured MAG at step 405. When the absolute value of (MAG-AGC_THRES) is greater than HYST, then a variable representing a shifted AGC_THRES, named AGCSHIFT, is set equal to AGC_THRES, and a variable that counts steps of the gain control value, named COUNT, is set to 0, at step 420.

If MAG is greater than or equal to AGCSHIF at step 425, then if the pointer (POINT) is less than the maximum pointer value (POINTMAX) at step 460, the value adjustment at POINT is acquired at step 465 and used at step 470 to decrease the gain control value by the value adjustment amount. If, however, POINT is equal to POINTMAX at 460, no change is made to the gain control value (it is already at a value that sets the gain of LNA 116 to a minimum gain), and the process awaits the next measured MAG at step 405. Next, at step 475, AGCSHIFT is shifted 1 bit left, POINT is incremented by 1, and COUNT is incremented by 1. Next, if POINT is equal to POINTMAX, the newly determined gain control value (which is at the value that sets the gain of LNA 116 to a minimum gain) is coupled at step 490 to the LNA 116 at the next symbol edge, as described above, and the process awaits the next measured MAG at step 405. If however, at step 480, POINT is not equal to POINTMAX, and COUNT is not equal to COUNTMAX at step 482, and MAG is not less than AGCSHIFT at step 485, then the process continues at step 465 to determine whether another approximately 3 dB decrease in gain is appropriate in an attempt to make MAG<AGCSHIFT at step 485. If COUNT is equal to COUNTMAX at step 482, then the newly determined gain control value is coupled at step 490 to the LNA 116 at the next symbol edge, and the process awaits the next measured MAG at step 405. This limit is used to prevent gain changes of absolute value larger than approximately (3 dB)*(COUNTMAX). COUNTMAX is set to 6 (approximately 18 dB) for a typical combination of radio environment and radio type. If MAG is less than AGCSHIFT at step 485, then the newly determined gain control value is coupled at step 490 to the LNA 116 at the next symbol edge, and the process awaits the next measured MAG at step 405.

If MAG is less than AGCSHIFT at step 425, then if the pointer (POINT) is greater than the minimum pointer value (0) at step 430, the value adjustment at POINT is acquired at step 435 and used at step 440 to increase the gain control value by the value adjustment amount. If, however, POINT is not greater than 0 at 430, no change is made to the gain control value (it is at a value that sets the gain of LNA 116 to a maximum gain), and the process awaits the next measured MAG at step 405. Next, at step 445, AGCSHIFT is shifted 1 bit right, POINT is decremented by 1, and COUNT is incremented by 1. Next, if POINT is equal to 0 and if MAG is less than or equal to AGC_THRESSO at step 453, then the step attenuator 114 is set to the non-attenuate state at step 454, the newly determined gain control value is coupled at step 490 to the LNA 116 at the next symbol edge, and the process awaits the next measured MAG at step 405. If POINT is equal to 0 at step 450 and if MAG is greater than AGC_THRESSO at step 453, then the step attenuator 114 is kept in the attenuation state, the newly determined gain control value is coupled at step 490 to the LNA 116 at the next symbol edge, and the process awaits the next measured MAG at step 405. If however, at step 450, POINT is not equal to 0, and COUNT is not equal to COUNTMAX at step 452, and MAG is not greater than or equal to AGCSHIFT at step 455, then the process continues at step 435 to determine whether another approximately 3 dB increase in gain is appropriate in an attempt to make MAG>=AGCSHIFT at step 455. If COUNT is equal to COUNTMAX at step 452, then the newly determined gain control value is coupled at step 490 to the LNA 116 at the next symbol edge, and the process awaits the next measured MAG at step 405. This limit is used to prevent gain changes of absolute value larger than approximately (3 dB)*(COUNTMAX). If MAG is greater than or equal to AGCSHIFT at step 455, then the newly determined gain control value is coupled at step 490 to the LNA 116 at the next symbol edge, and the process awaits the next measured MAG at step 405.

It will be appreciated that there are variations of the track mode that are obvious to one of ordinary skill in the art that could be used to accomplish the same results as achieved by the preferred embodiment of the present invention. In one alternative embodiment that has been implemented, the track mode technique described in FIG. 4 is used, except that the gain control value is not changed as described in steps 470, 440 and the pointer value (POINT) is not changed in steps 475 and 445. Then, when a YES is determined at one of steps 485, 455 respectively, another loop is performed COUNT times, each time adjusting pointer value POINT by one and changing the gain control value by the adjustment value associated with each value of POINT, and then the new gain value is transferred at step 490. In other examples of variations to the preferred embodiment, the MAG, instead of the AGC_THRES, could be shifted to determine the COUNT needed to produce the MAG that is 3 dB different than the previous one; the direction of increase for the pointer could be reversed; steps 470 and 475 could be reversed, etc. Furthermore, there are certain aspects of the track mode that if not performed will reduce, but not eliminate, all the benefits of the present invention. For example, steps 482 and 452 could be left out with a consequence that the gain would be allowed to fluctuate more under some circumstances, making the AGC system 100 somewhat less stable in those circumstances.

It will be further appreciated that the use of the binary voltage squared signal and the stored gain response in this AGC system allows gain changes in multiples of approximately 3 dB, by shifting AGCSHIFT 1 bit left or right as needed to determine new gain values, which makes the circuitry to implement this technique very simple compared to prior art AGC systems and which makes the control of the gain linear with reference to power. Without this linearity, the system could over-shoot and possibly oscillate with input power changes of the intercepted signal 113. Furthermore the ability of this AGC system 100 to provide a wide range of gain changes, for example varying between 3 dB and 18 dB, in one AGC update cycle, makes this AGC system run at faster time constants than prior art AGC systems. This AGC system 100 allows for a controlling processor to vary the gain change sizes by varying COUNTMAX which can be reduced when the AGC system is operating near the AGC threshold, thereby reducing the settling time and improving the stability of the AGC system 100 compared to prior art AGC systems.

The AGC Filter

Figure 5:
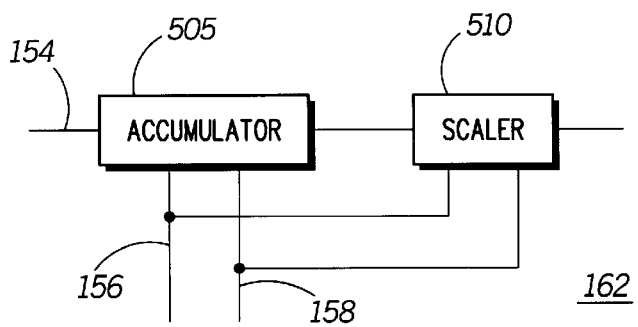
FIG. 5 is a block diagram of an AGC integration filter.
Figure 6:
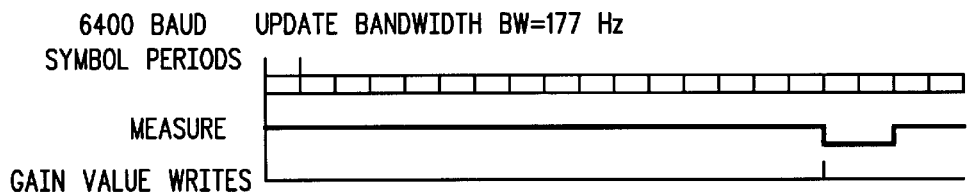
FIGS. 6–9 are timing diagrams of an AGC track mode update bandwidth control for various update bandwidths.
Figure 7:
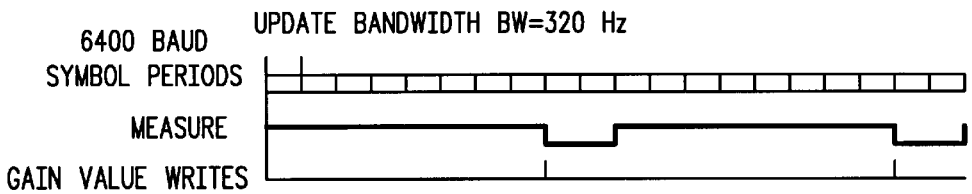
Figure 8:
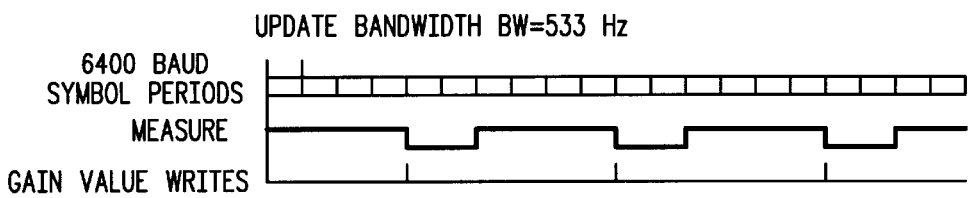
Figure 9:
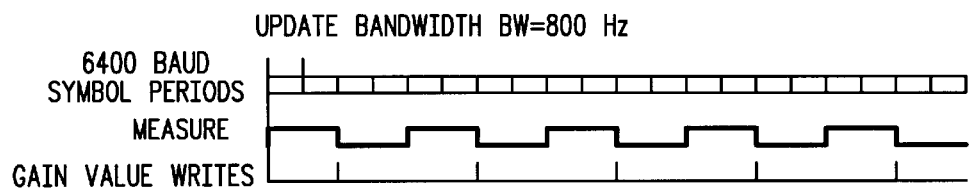

Referring to FIG. 5, an electrical block diagram of the AGC filter 162 is shown in accordance with the preferred embodiment of the present invention. The AGC filter 162 comprises an accumulator 505 coupled to an input of a scalar 510. Coupled to both the accumulator 505 and the scalar 510 are the bandwidth signal 156 and the symbol rate signal 158.

The accumulator 505 is controlled by the signals 156, 158 which set the number of samples and the accumulation duration, during one gain control update cycle, as shown in Table 1.

TABLE 1

| BANDWIDTH (Hz) | SYMBOL RATE (Symbols per Sec.) | ACCUMULATION SAMPLES (#) | ACCUMULATION DURATION (usec.) |
|---|---|---|---|
| 800 | 1600 | 15 | 625 |
| 800 | 3200 | 30 | 625 |
| 533 | 1600 | 30 | 1250 |
| 533 | 3200 | 60 | 1250 |
| 320 | 1600 | 60 | 2500 |
| 320 | 3200 | 120 | 2500 |
| 177 | 1600 | 120 | 5000 |
| 177 | 3200 | 240 | 5000 |

The accumulator 505 is further controlled by the symbol rate signal 158 as shown in table 2, to stay cleared in the reset state for the number of samples shown, the rest state having the duration shown, at the beginning of each gain control updated cycle.

TABLE 2

| SYMBOL RATE (Symbols per Sec.) | RESET SAMPLES (#) | RESET DURATION (usec.) |
|---|---|---|
| 1600 | 14 | 583 |
| 3200 | 29 | 604 |

Referring to FIGS. 6, 7, 8, and 9, timing diagrams show the reset durations and accumulate durations (as portions of the signal labeled MEASURE) in comparison to symbol periods of 6400 baud symbols (labeled as 6400 BAUD SYMBOL PERIODS), and show the gain control value update that occurs during each of the gain control value update cycles (labeled as GAIN VALUE WRITES), in accordance with the preferred embodiment of the present invention. These relationships are shown for four different loop bandwidths: 177 Hz in FIG. 6, 320 Hz in FIG. 7, 533 Hz in FIG. 8, and 800 Hz in FIG. 9. It will be appreciated from these figures that the accumulate durations for different loop bandwidths have a relationship of $2^M$, while the reset durations are essentially constant. It will be further appreciated from Tables 1 and 2 that the accumulate durations and the reset durations for different symbol rates are essentially the same for a particular bandwidth.

The output of the accumulator is 15 to 240 times the average amplitude of the unfiltered recovered signal 154. This accumulator output is then reduced by the scaler 510 by a first gain scaling as shown in Table 3.

TABLE 3

| BANDWIDTH (Hz) | SYMBOL RATE (Symbols per Sec.) | Shift right (Number of bits) |
|---|---|---|
| 800 | 1600 | 4 |
| 800 | 3200 | 5 |
| 533 | 1600 | 5 |
| 533 | 3200 | 6 |
| 320 | 1600 | 6 |
| 320 | 3200 | 7 |
| 177 | 1600 | 7 |
| 177 | 3200 | 8 |

After this first scaling, the signal has a value of $^{15}/_{16}$ of one sample. This value is then normalized by a second scaling of $^{17}/_{16}$, which yields an output that is approximately the average value of the samples in the accumulator, normalized to one sample, regardless of the selected incoming symbol rate and filter bandwidth 100 to use one set of AGC threshold values for a radio that is independent of the selected bandwidth and symbol rate, a feature not available in prior art AGC systems.

It will be appreciated that the above relationships can be expressed more generally as: The symbol rate signal 158 indicates one of two symbol rates that have a factor of two relationship with each other. The accumulator 505 generates a binary output that is an accumulation of a quantity of the samples occurring during one gain control value update cycle. The ratio of the quantities for any two symbol rates is essentially inversely proportional to the ratio of the two symbol rates. The scalar performs a reduction of the binary output by a factor that is essentially equal to the quantity, by a binary right shift operation. The quantity is given by the formula $((2^N)-1)*2^M$, where N and M are integers. The binary right shift operation shifts the output right M+N bits. The factor is $2^N*2^M$. The scalar performs an adjustment of the reduced binary output of $((2^N)+1)/(2^N)$.

The RSSI Function

Figure 10:
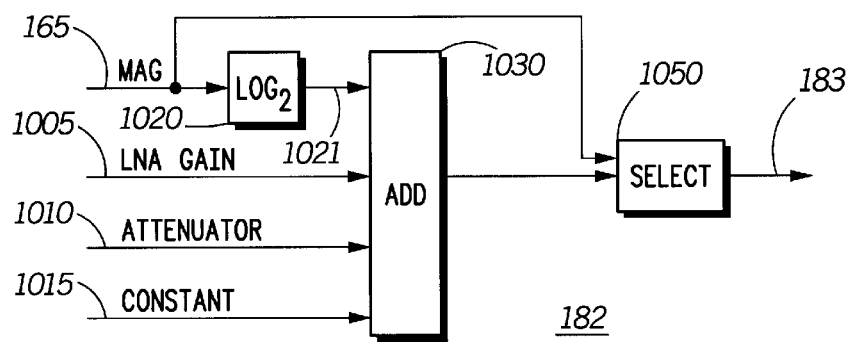
FIG. 10 is a block diagram of a received signal strength indicator.

Referring to FIG. 10, an electrical block diagram of the RSSI function 182 is shown, in accordance with the preferred embodiment of the present invention. The RSSI function 182 comprises a log function ($LOG_2$) 1020, an addition function (ADD) 1030, and a selection function 1050 (SELECT). The addition function 1030 adds together four binary values. One is a LNA GAIN 1005 obtained from the stored gain response 180. The LNA GAIN 1005 represents the most recent relative gain to which the LNA 116 has been set; that is, the difference in dB from the maximum gain of the LNA 116, in 3 dB steps. This is preferably obtained by a count of the gain steps (pointer location steps) from the maximum gain to the present pointer location, and is preferably 4 bits wide. Another is an ATTENUATOR signal 1010 having a value that represents, in 3 dB steps, the attenuation of the step attenuator 114 relative to the non-attenuation state, in dB (e.g., 0 or 18), and is preferably 3 bits wide. A third is a 5 bit binary Mu-law signal 1021 generated by the $LOG_2$ function 1020. The value of this Mu-law signal 1021 is the ordinal position of the highest order bit of the value, MAG, of the binary voltage squared signal 165 that has a "1" value, and is preferably 5 bits wide. The Mu-law signal 1021 is an approximation of $Log_2$ (MAG). The fourth is a constant 1015 that generates a result of zero from the output of the addition function 1030 when the constant is added to a $LOG_2$ signal 1021 that is generated while a 0 dBm signal is injected into the conducted input 111 (FIG. 1) (or intercepted by the antenna 112), the LNA 116 is operated at maximum gain, and the step attenuator 114 is in the non-attenuation state. The constant 1015 is preferably a 5 bit wide value. The output of the addition function 1030 is a binary value of width X that represents the power in dBm of the intercepted signal 113. This is termed the low resolution RSSI, and it is selected by the selection function 1050 when the AGC system 100 is in the track mode 172. When the low resolution RSSI output is selected, it is coupled to a host processor of the radio 1100 which includes the low resolution RSSI output in messages that are sent to a fixed portion of a radio communication system. The low resolution RSSI is used to perform such operations as fixed transmitter power adjustment and fixed transmitter selection, and is also used within the AGC radio 1100 (FIG. 11), for example, in performing error correction of recovered signals. In the preferred embodiment of the present invention, X is 10. It will be appreciated that because the low resolution RSSI is used for purposes that tolerate a much longer delay time than can be tolerated by the loop of the AGC system 100, the log function 1020, the addition function 1030, and the selection function 1050 are preferably performed in a host processor of the radio 1100 instead of being implemented in the portions of the custom integrated circuit preferably used for the other unique digital functions of the AGC system 100.

During the suspend test mode 174, the selection function 1050 selects the value, MAG, of the binary voltage squared signal 165. The full bit width, W, of the value MAG is passed to the output of the selection function 1050 in the track mode 172 and coupled to a host processor of the radio 1100. The host processor couples this high resolution, uncorrected, filtered signal to a measurement instrument during a factory tuning operation. In accordance with the preferred embodiment of the present invention, W is 21, which provides a resolution of 0.01 dB and a total range of 63 dB. This allows a highly accurate peak tuning to be performed, making possible a simplified, precision, automatic radio tuning.

Referring to FIG. 11, an electrical block diagram of the radio 1100 is shown, in accordance with the preferred embodiment of the present invention. The radio (also referred to as an AGC radio) comprises the antenna 112 coupled to an AGC receiver 1101 that includes the AGC system 100. The AGC receiver 1101 is preferably a ZIF or direct conversion receiver but could be of another type. The recovered I and Q signals 145, 147 are coupled from the AGC system 100 of the AGC receiver 1101 to the controller 1105, which demodulates and decodes them and processes information included in the I and Q signals, in a conventional manner. The controller 1105 performs conventional functions such as protocol symbol synchronization and demodulation, protocol decoding, error decoding, address checking, etc. The controller 1105 comprises one or more conventional microprocessors combined with appropriate stored program instructions. Information decoded from the I and Q signals 145, 147 and information generated within the controller 1105 are presented on the display 1115 for presentation to a user. The AGC radio 1100 also comprises other conventional user interfaces such as switches (not shown in FIG. 11), and can optionally include one or more other conventional user interface elements such as a speaker, vibrator and LED indicators (not shown in FIG. 11), and can optionally include a transmitter (not shown in FIG. 11)

coupled to the antenna 112. The controller 1105 controls the AGC receiver 1101 to select a particular radio channel and to go into various operational modes by means of control signal 1110. During the track mode 172 in a radio having a transmitter, the low resolution RSSI is generated, and coupled by the RSSI signal 183 to the controller 1105, which couples an encoded version of the low resolution RSSI to the transmitter via serial signal 1120 to inform a fixed network of the received signal strength. When the AGC radio 1100 is being manufactured, the AGC radio 1100 is put into the suspend test mode 174, during which mode the high resolution RSSI is coupled to the controller 1105, which couples the high resolution RSSI via serial signal 1120 to a factory tuning equipment, where it is used to optimally tune the radio 1100. It will be appreciated that alternatively, the high resolution RSSI can be encoded and transmitted when the AGC radio includes a transmitter, which can reduce manufacturing costs by eliminating wired connection to the AGC radio for the purpose of obtaining the high resolution RSSI.

Other architectures are contemplated in the block diagram of FIG. 11. For example, the symbol demodulation and synchronization functions referred to above can alternatively be accomplished by a digital signal processor that performs the functions of the magnitude corrector 170 and other portions of the receiver 1101 described above.

It will be appreciated that although the AGC system 100 has been described in the context of a radio frequency receiver, the present invention will provide similar benefits in other types of receivers, an example of which is an infrared light receiver.

Determining the Stored Gain Response

Figure 12:
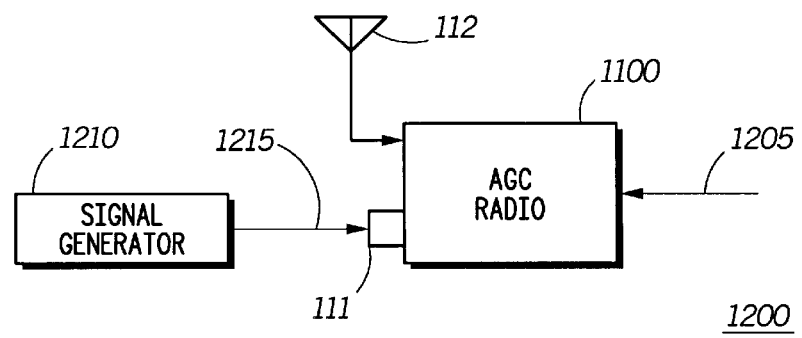
FIG. 12 is a simplified block diagram of an AGC radio configured for calibration mode.

Referring to FIG. 12, an electrical block diagram 1200 of a calibration setup for determining and storing the stored gain response of the radio 1100 is shown in accordance with the preferred embodiment of the present invention. The calibration setup comprises a signal generator 1210 that is coupled to the conducted input 111 of the AGC radio 1100. A signal 1205 is coupled to the AGC radio 1100 that puts the AGC radio into the calibrate mode 173 and starts a calibration process. The signal generator generates a constant power level signal 1215, that can be within several dB of a predetermined signal level; it need not be set precisely to the predetermined signal level because the calibration and use of the unique stored gain response obviates the need for use of an absolute signal level. This reduces the cost of the test procedure. The calibration described herein can alternatively be performed using a radiated coupling of the calibration signal into the AGC radio 1100, instead of a conducted coupling, as long as the power level of the signal intercepted by the AGC radio 1100 remains constant during the calibration procedure. This is another advantage of the procedure, since several AGC radios 1100 could be calibrated simultaneously.

Figure 13:
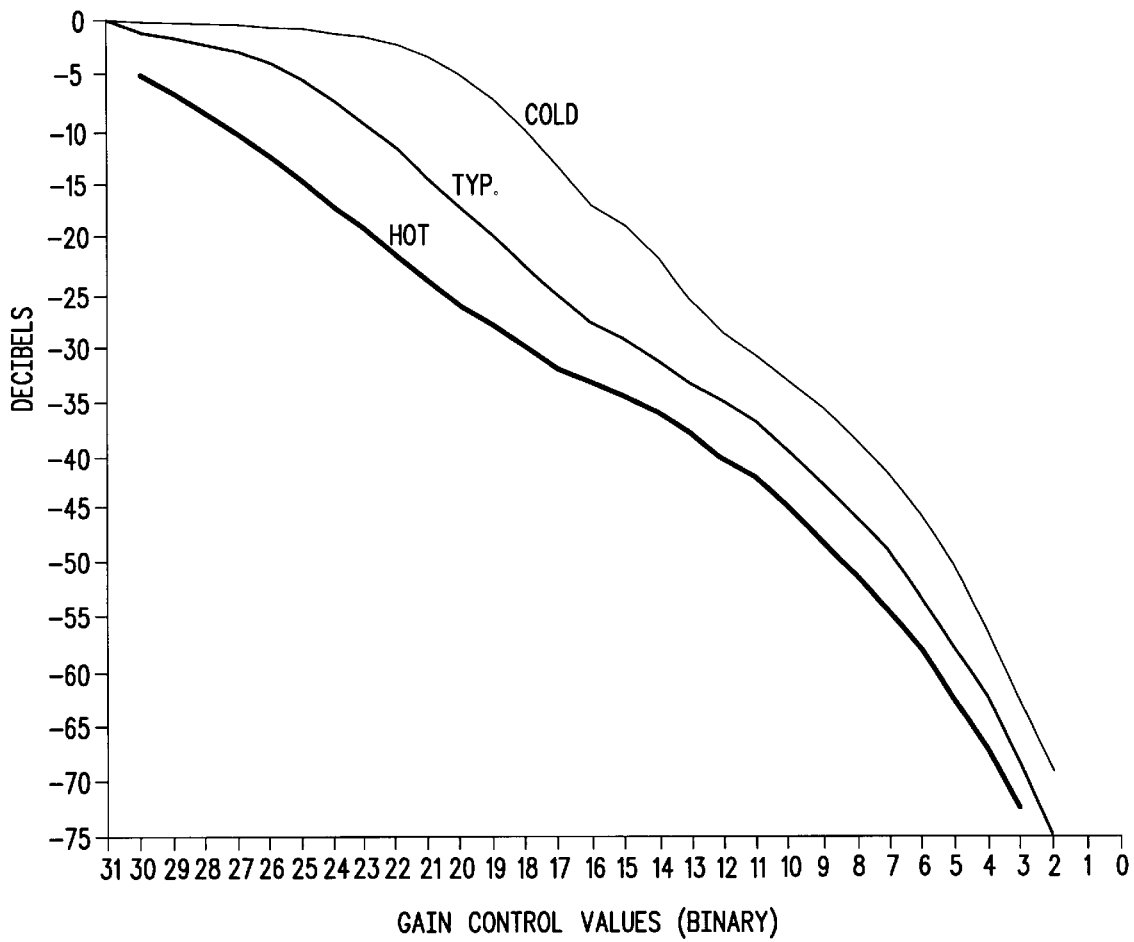
FIG. 13 is a chart of a gain response curve of a low current LNA at various temperatures.

Referring to FIG. 13, a graph showing plots of gain (in dB relative to a maximum gain referenced to 0 dB) versus the digital gain control values 194 (FIG. 1) coupled to the DAC 190, for a typical LNA 116 of the AGC system 100 is shown in accordance with the preferred embodiment of the present invention. Three curves are shown, one at a hot temperature, one at a normal ("TYP.") temperature and one at a cold temperature. The gains are essentially all negative gains because they are losses with reference to the amount of gain of the LNA 116 at the maximum gain control value, which in this example, is a digital value of 31. It will be appreciated that the curves are non-linear, and since the vertical scale is logarithmic, the LNA 116 is properly described as a non-logarithmic amplifier. It will be further appreciated that when the gain control value 194 is set to zero, the LNA 116 is shut down, and is therefore in a unique state of lowest gain, as described with reference to block 205 of FIG. 2.

Figure 14:
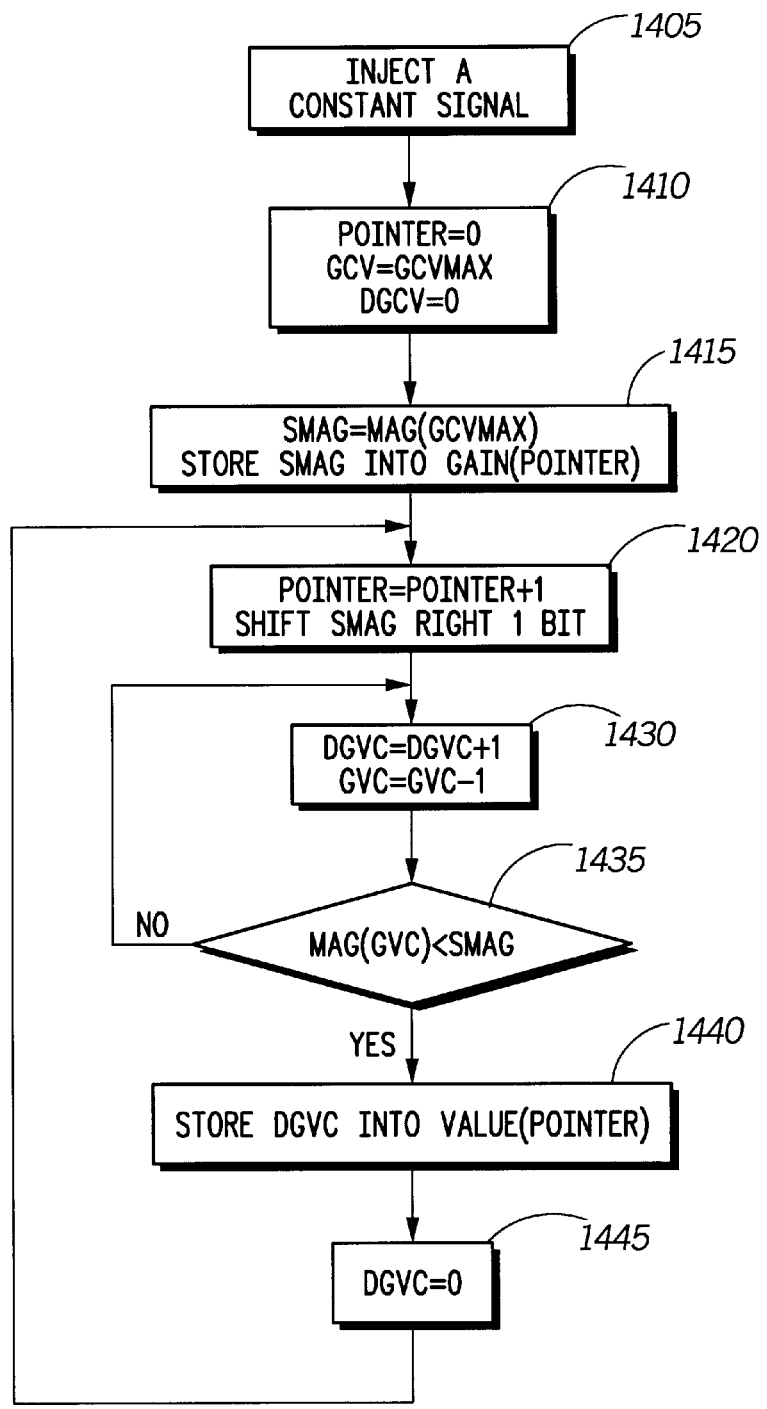
FIG. 14 is a flow diagram for calibration sequence.

Referring to FIG. 14, a flow chart of a method for determining the stored gain response for the AGC system 100 is shown, in accordance with the preferred embodiment of the present invention. At step 1405, the signal of constant power level has a predetermined type of modulation 1215 (in some types of systems, an modulated signal can be used) and is coupled to the conducted input 111 of AGC radio 1100. At step 1410, the controller 1105 initializes the pointer to value 0, initializes the gain control value (GCV) 195 to a maximum gain control value, GCVMAX, which in this example is a digital value of 31, and initializes a gain control step counter, DGCV, to 0. At step 1415, a value named "shifted recovered signal power", SMAG, is initialized to the value of the recovered power, MAG(GCVMAX), that is measured at GCVMAX. Also, GCVMAX is stored into the stored gain response registers at the value adjustment (VALUE(0)) associated with the maximum gain, at location 0. Then, at step 1420, the pointer is incremented by 1 and SMAG is shifted right by 1 bit. At step 1430, the step counter, DGCV, is incremented by 1, and the gain control value 194 is decremented by 1. The recovered signal power at the current gain control value, MAG(GCV) is compared to SMAG, and if it is greater than or equal to SMAG at step 1435, then at step 1440, the value of the gain control counter (DGCV) is stored into the value adjustment (VALUE (POINTER)) associated with the current value of the pointer, the gain control counter (DGCV) is reset to 0 at step 1445, and the method continues at step 1420.

When MAG(GCV) is less than SMAG at step 1435, then the method continues at step 1430. The method continues until the pointer reaches a maximum value (in this example, 19), at which point the stored gain response is complete. By this method, a gain response is stored that provides a logarithmic gain response for the combination that includes the gain corrector 170 and the non-logarithmic LNA 116; which is to say that linear changes of the a binary voltage squared signal (165) cause essentially logarithmic changes at the output of the LNA 116.

It will be appreciated that the method just detailed can be described in other words as follows: The shifted recovered signal power, SMAG, is alternatively described as a relative binary voltage square signal, because it is determined relative to the recovered signal power measured at the maximum gain control value by repeated right shifts of the maximum gain control value. The comparison performed at step 1435 is alternatively described as comparing a binary voltage squared value of the recovered signal (MAG(GCV)) generated at a second gain control value and a relative binary voltage squared value (SMAG) (obtained by shifting a relative binary voltage squared value associated with a first gain control value) to determine a sign of a difference of the values. Step 1430 can be described as determining the number of times the step of comparing is repeated. The loop comprising steps 1430, 1435 comprises a repetition until the sign of the difference is a predetermined value (in the example detailed, until MAG(GCV)<SMAG). Finally, step 1440 can be described as storing, as a value adjustment, the number of times (DGCV) the step of comparing is repeated between two consecutive steps (1435) of determining a sign of the difference.

It will be further appreciated that this method of storing a gain response curve is much easier and faster than prior art manual methods, and requires no adjustments of the signal generator to accomplish.

The gain response function that is stored by this method can be fundamentally described as comprising an ordered set of registers, wherein each register stores a gain adjustment value, and a gain control output, wherein each of the gain adjustment values is a value that, when subtracted from or added to a present value of the gain control output, generates a new value of the gain control output that is different than the present value by an amount that changes the gain of the non-logarithmic amplifier essentially by a predetermined number of decibels.

Alternatively, the stored gain response can be described as comprising an ordered set of registers having a first register, wherein each register except the first register stores a gain adjustment value, a pointer coupled to a digital input that points to one of the registers (the pointed register) and a gain control value output. The gain control output is generated as the sum of the value stored in the pointed register and all of the values stored in the registers between the first register and the pointed register, combined by subtraction or addition with the value stored in the first register, wherein the gain adjustment values are such that the gain control output controls the non-logarithmic amplifier in a logarithmic manner with reference to the digital input.

It will be further appreciated that gain responses at a plurality of temperatures can be stored in the AGC radio 1100 in relatively small amounts of memory, and can used in conjunction with a temperature measured by the AGC radio 1100 to further refine the accuracy of the gain adjustments made within the AGC system 100. For example, three gain curves such as those shown in FIG. 13 can be stored during factory calibration, with the hot and cold curves taken at the maximum and minimum operating temperatures for the AGC radio 1100. Then, during operation, the AGC radio measures the temperature within the AGC radio 1100, for example, at a heat sink of the LNA 116, and compares the measured temperature to temperatures measured at the heat sink during the factory calibration. A linear interpolation of two of the three gain control values can then be used to determine a refined gain control value that is used for the gain control value 194.

The Squaring Function

Figure 15:
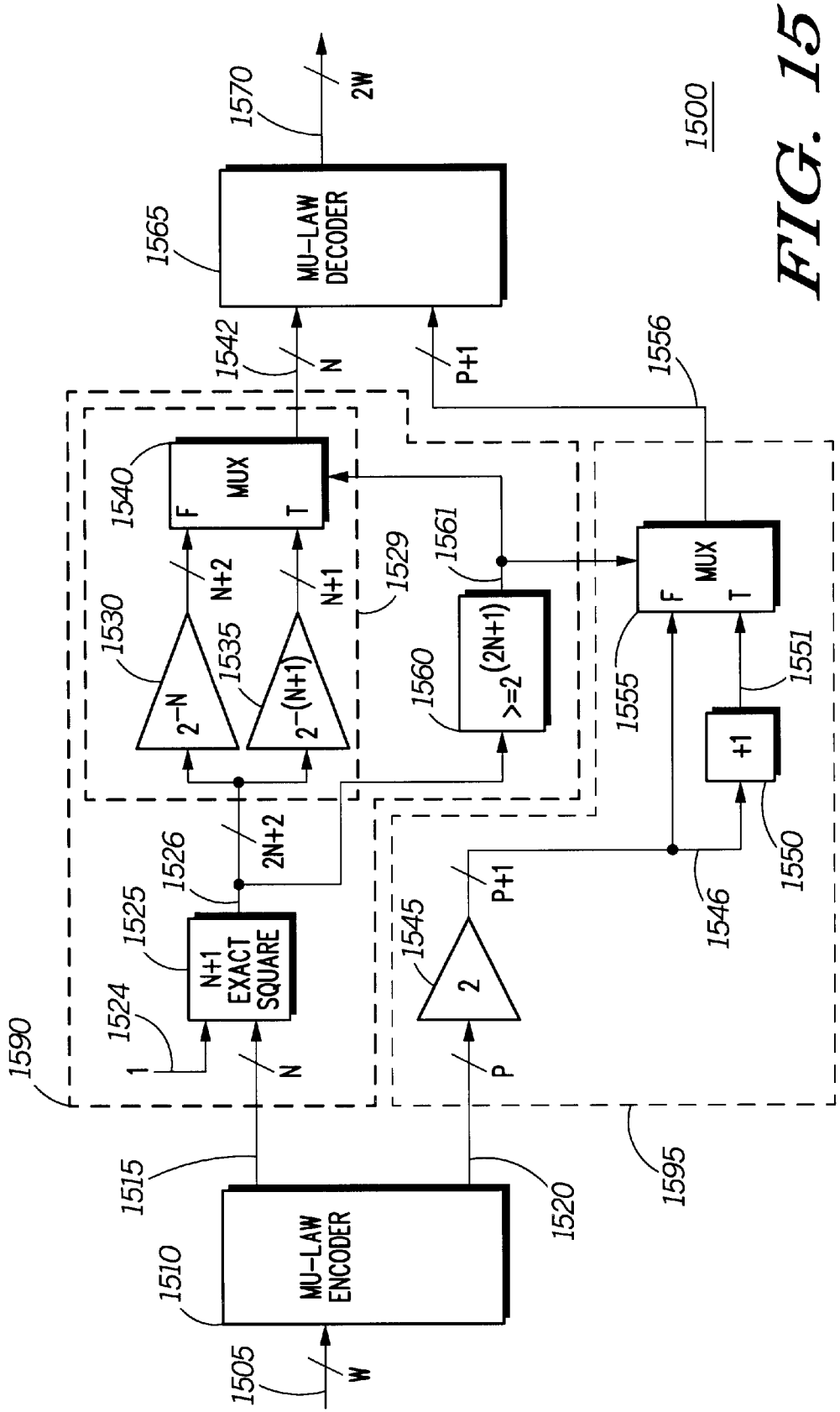
FIG. 15 is a block diagram of the multiplier 148 of FIG. 1, used in AGC power detection.

Referring now to FIG. 15, an electrical block diagram of a squaring circuit 1500 that is used for each of the two squaring functions 148, 150 (FIG. 1) is shown in accordance with the preferred embodiment of the present invention. The two squaring circuits are preferably implemented as logic circuits that are part of a state machine included in a custom integrated circuit. The signals coupled to elements of the squaring circuits 1500 that are expressed herein as having width are binary parallel signals wherein the number of parallel lines is expressed as the width. The squaring circuit 1500 comprises a logarithmic compression function 1510, a doubling function 1595, a squaring function 1590, and a logarithmic decompression function 1565. The logarithmic compression function 1510 accepts a binary input 1505 of width W and value X, and produces an output having a binary power component 1520 of value POWER, and a binary magnitude component 1515 of value MAGNITUDE, that together represent X to an predetermined amount of precision, N, which is to say the answer is accurate to N significant bits. The binary input 1505 of one of the squaring circuits 1505 is coupled to the I signal 145, and the binary input 1505 of the other of the squaring circuits 1505 is coupled to the Q signal 147. The squaring function 1590 generates an adjusted squared magnitude component 1542 of width N and a selection signal 1561 from MAGNITUDE. The doubling function 1595 generates a doubled power component 1556 based on POWER and the selection signal 1561. The logarithmic decompression function 1565 generates an approximate squared output of width 2 W from the doubled power and adjusted squared magnitude components 1556, 1542 that has a value that approximates the square of X to the predetermined amount of precision, N. In accordance with the preferred embodiment of the present invention, W=32 and N=6.

In accordance with the preferred embodiment of the present invention, the logarithmic compression and decompression functions 1510, 1565 are Mu-law type functions. The logarithmic compression function 1510 generates the binary magnitude component 1515 with a width of N (N being a design choice) and the binary power component 1520 with a width of P, where $2^{(P-1)}<W<=2^P$ and wherein P and W are integers. In the preferred embodiment, P=5. The logarithmic compression function 1510 comprises a power function that generates POWER according to the relationship POWER=int($\log_2(X)$), and further comprises a magnitude function that generates MAGNITUDE according to the relationship MAGNITUDE=int($X*2^{(N-POWER)}$)$-2^N$. The circuitry to implement these relationships is well known to one of ordinary skill in the art.

A specific example of the preferred embodiment is:
X=0000 0101 0111 1001 1101 0000 0001 1001
POWER=1 1010
MAGNITUDE=01 0111

The squaring function 1590 comprises an exact square function 1525 that generates an exact square signal 1526 that has width 2N+2 in response to the value of an augmented magnitude input that comprises the binary magnitude component 1515 augmented by a high order bit 1524. The squaring function 1590 preferably comprises a lookup table that generates the exact square signal 1526 having one of $2^{(N+1)}$ values for each value of the augmented magnitude input, the exact square having a value that is an exact square of the augmented input. Implementations other than a lookup table could be used, such as a conventional multiplication circuit dedicated to each exact square function 1590. For the example given above, the augmented magnitude input is 101 0111, and the exact square is 01 1101 1001 0001. The squaring function 1590 also comprises a steering circuit 1560 coupled to the exact square function 1525 that uses a comparator to compare the value of the exact square signal 1526 to the binary value $2^{(2N+1)}$ and generate a steering signal 1561. The steering signal 1561 has a TRUE state when the value of the exact square signal 1526 is greater than or equal to the binary value $2^{(2N+1)}$, and has s FALSE state for the alternative result. In the example being described, $2^{(2N+1)}$ is $2^{13}$, so the steering signal 1561 is FALSE. The squaring function 1590 further comprises an adjustment function 1529 that generates the adjusted squared magnitude component 1542 from the exact square. The adjusted squared magnitude component 1542 has a precision and width of N bits. The adjustment function 1529 comprises a first integer-divider 1530 that performs an integer operation on the result of a division of the exact square signal 1526 by ($2^N$), a second integer-divider 1535 that performs an integer operation on the result of a division of the exact square signal 1526 by ($2^{(N+1)}$), and a multiplexer 1540 that selects the lowest N significant bits of the output of the first integer-divider 1530 when the state of the steering signal is FALSE or the lowest N significant bits of the output of the second integer-divider 1535 when the steering signal is TRUE. The selected bits are the adjusted squared magnitude component 1542. In the example being described, the first integer-divider 1530 is selected, so the adjusted squared magnitude component 1542 is 11 0110.

The doubling function 1595 preferably comprises a left shift function 1545 that generates a doubled power signal 1546 having a width of P+1 and a value double that of POWER by shifting the binary power component 1520 one bit left in a shift register, an adder 1550 that generates an augmented doubled power signal 1551 by adding a binary one to the value of the doubled power signal 1546 in an adder, and a multiplexer 1555 that generates the doubled power component 1556 by selecting the doubled power signal 1546 when the steering signal 1561 is FALSE and the augmented doubled power signal 1551 when the steering signal 1561 is TRUE. In the example being described, the steering signal 1561 is FALSE, so the doubled power component has a value of 11 0100.

It will be appreciated that in the squaring circuit 1500 described above, the squaring function 1590 generates the adjusted squared magnitude component 1542 having a value of ADJSQMAG, and the doubling function 1595 generates the doubled power component 1556 having a value of DBLPOWER, by the following relationships:

When $(MAGNITUDE+2^N)^2 >= 2^{(2N+1)}$,
ADJSQMAG=N least significant bits of
  $int(((MAGNITUDE+2^N)^2)*2^{-(N+1)})$ and
DBLPOWER=2* POWER+1;
When $(MAGNITUDE+2^N)^2 < 2^{(2N+1)}$,
ADJSQMAG=N least significant bits of
  $int(((MAGNITUDE+2^N)^2)*2^{-N})$ and
DBLPOWER=2* POWER.

The logarithmic decompression function 1565 generates the approximate squared output 1570 from ADJSQMAG and DBLPOWER, as:

$(ADJSQMAG+2^N)*2^{(DBLPOWER-N)}$.

In the example being described, ADJSQMAG=11 0110 and DBLPOWER=11 0100 (Decimal 52); therefore, the approximate squared output 1570 in this example is (111 0110)*$2^{46}$.

In a version of the squaring circuit 1500 in which W=32 and N=6, the squaring circuit 1500 reduces the required integrated circuit die area to less than 20% of that required for a prior art, non-sequential implementation, while providing a precision of at least 0.1 dB, so it will be appreciated that the cost and power savings of the present invention are substantial.

It will also be appreciated that in alternative embodiments the precision of the adjusted squared magnitude component 1542 can be increased up to 2N bits by changing the divisor of the first and second integer-dividers 1530, 1535. For example, a precision of 2N bits is achieved by changing the first integer-divider 1530 to one that performs no division operation on the exact square signal 1526, and by changing the second integer-divider 1535 to one that performs an integer operation on the result of a division of exact square signal 1526 by 2. In these alternative embodiments, although less shifting is performed in the integer-dividers 1530, 1535, more bits have to be multiplexed in the multiplexer 1540 and handled at the input of the Mu-law decoder 1565.

It will be further appreciated that although the squaring circuit 1500 has been described with reference to a radio receiving circuit, it is useful in any integrated circuit and in any electronic device in which a need exists for a squaring function from which an approximate result is satisfactory, and that the amount of precision of the result can be adjusted by modifying the value of N.

Some of the terms used in the description below differ from terms used above but describe the same items. For example gain control signal 195 above is referred to as the AGC voltage below. And gain control value 194 is referred to below as the DAC value.

AGC Performance Adjustment

Figure 16:
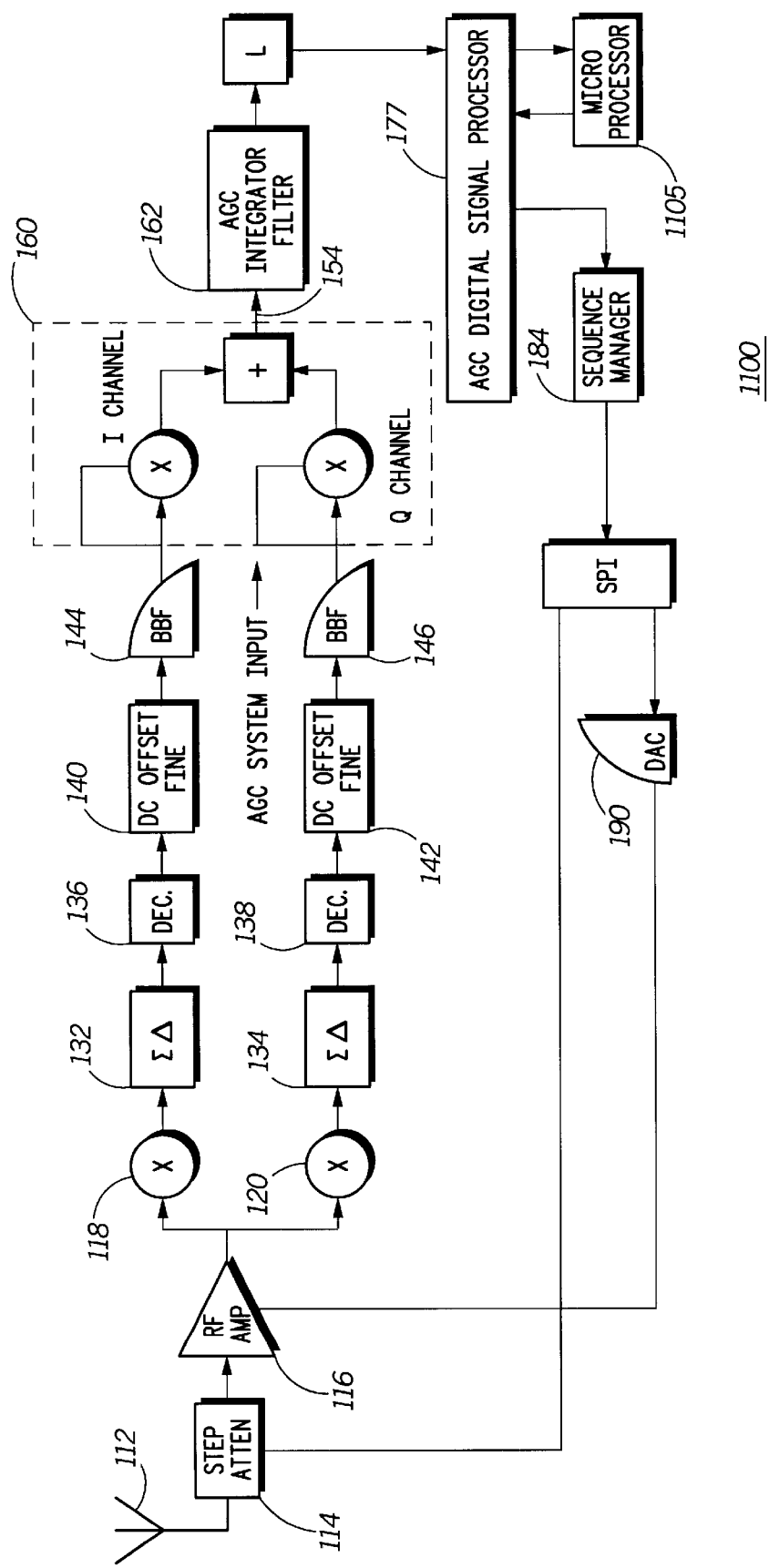
FIG. 16 is a block diagram of an alternative embodiment of a radio system with AGC processing using an AGC digital signal processor.

Referring to the FIG. 16, a block diagram shows portions of the radio 1100 that includes the antenna 113, the step attenuator 114, and the LNA 116. The LNA 116 has outputs coupled to two down mixers 118, 120. The down mixers translate a received signal to zero IF. (This invention could alternatively use two stages of down conversion. Using two stages of down conversion would require the use of four down mixers. The first two mixers would mix down to an IF, intermediate frequency, and the second two mixers would mix down to zero intermediate frequency.) The outputs of the I and Q mixers 118, 120 enter the sigma-delta data converters 132, 134 which change the signals from analog to digital and then build their word width in the decimation filters 136, 138, (labeled in the diagram as Dec). Following the decimation filters, the DC Offset circuits 140, 142 correct for DC offsets in both the I and Q wave forms. The signals are then filtered by the baseband filters 144, 146. The I and Q baseband signals enter the AGC power detector which is built by the function $I^2+Q^2$ 160. The power signal 154 is then filtered in the AGC Integrator Filter 162 and its output is latched. The AGC gain control processing and the control outputs are all determined by the gain corrector 170 (FIG. 1), in which one embodiment is implemented as an AGC Digital Signal Processor 177. (The AGC Digital Signal Processor 177 contains all signal processing for determining the input power, signal classification, and for determining corrective action to be applied to the gain of the radio.) The AGC Digital Signal Processor (DSP) 177 controls the LNA 116 and the step attenuator 114 in the front end integrated circuit 110. (In this disclosure, when the AGC DSP 177 cuts back the gain, it is inferred that the gain is distributed in some manner between the LNA and the step attenuator.)

It is apparent to one skilled in the art, that this radio 1100 can exist in one integrated circuit or be divided across multiple integrated circuits (chips). In the preferred embodiment, the radio 1100 is divided into two chips. The front end IC 110 (FIG. 1) contains the LNA 116 and step attenuator 114 which are both under the control of the AGC system. The filtering and signal processing of the baseband signal is contained on the back end IC 130 (FIG. 1).

Figure 25:
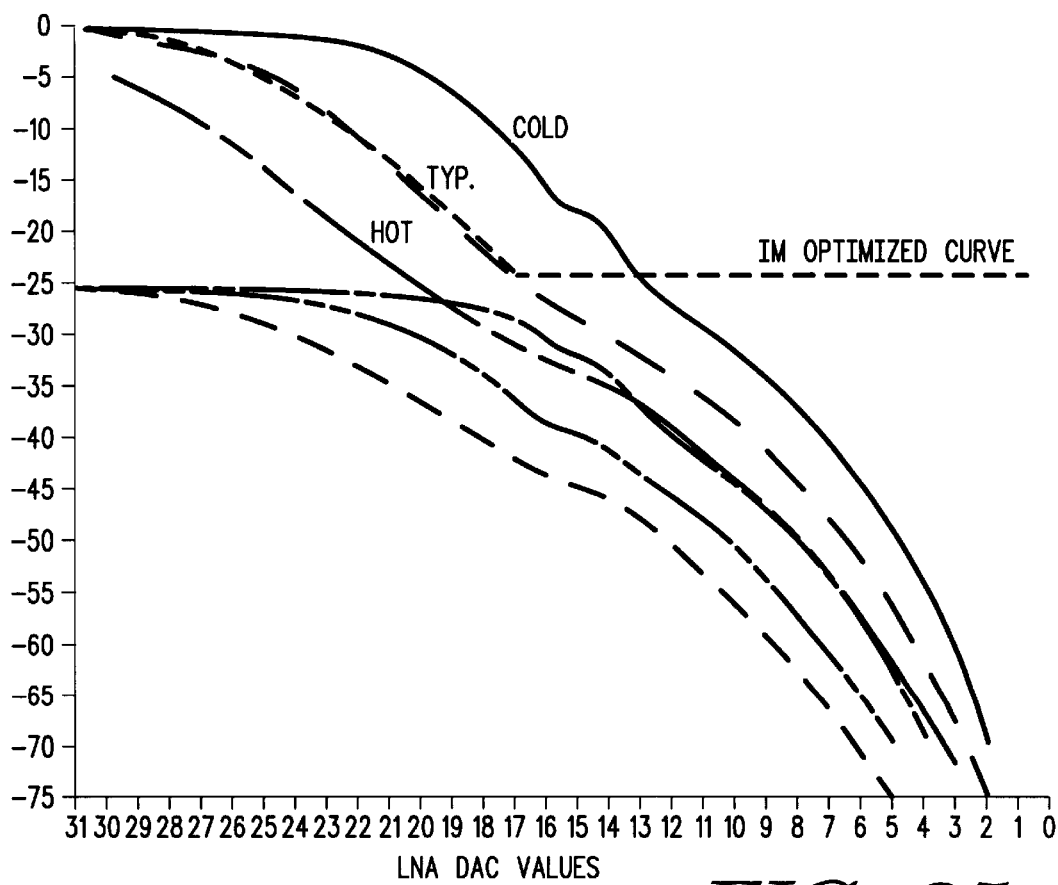
FIG. 25 is a chart of an optimized LNA gain response curve for intermodulation performance improvement.

The LNA 116 is a non-linear device and its output characteristic is shown in the LNA Gain Curve FIG. 25. The LNA gain is controlled in a non-linear fashion by an injected current 195 coming from the DAC 190 which receives update gain control values 194 (or simply gain values) from the AGC digital signal processor 177. As the numbers loaded in the DAC 190 increase, the control current to the LNA 116 increases, which in turn increases the gain. Therefore, the characteristic of the LNA gain vs. the DAC gain values 194 is also a non-linear response.

The majority of the AGC processing takes place inside the back end IC 130. This AGC process operates on the filtered power output of the baseband filter channels 165. The processing in the AGC DSP 177 is "linear" with reference to input power (i.e. the AGC operates in steps of decibels). Thus the feedback system needs to be linearized to allow the AGC calculation circuitry in the AGC digital signal processor 177 to properly control the LNA 116 in the front end IC 110 (i.e. the LNA gain changes must be in steps of decibels). Without the linearization, the AGC system 100 would overshoot and possibly oscillate with input level gain changes of the received signal.

The back end IC 130 (and thus the AGC circuitry) is designed to mate with multiple LNA designs that operate over three different bands with different gain line-ups. This can be a problem, but the problem is solved by calibrating and re-linearizing the AGC system 100. Also within one band, product designers are able to vary the gain of the LNA 116 and step attenuator 114 to deal with processing variations of over 15 dB.

The AGC system 100 can make gain adjustments as fast as the bandwidth setting allows. (Typically, it can easily operate at 400 Hz bandwidth which is twice as fast as former shipping products). Autocalibration allows for much easier and faster loading of the gain curve than by a manual method.

Figure 17:
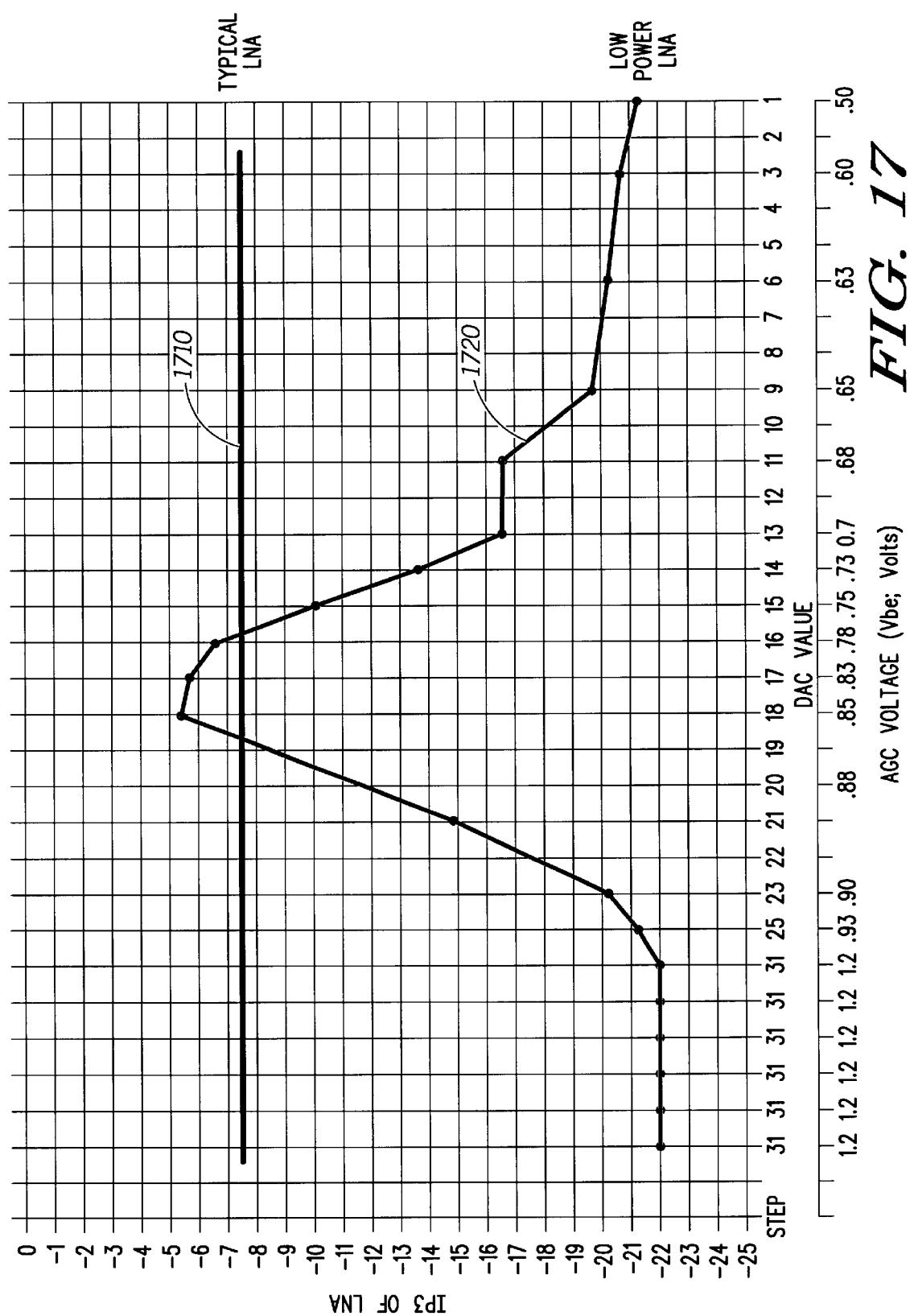
FIG. 17 is a chart of an intermodulation third order intercept point (IP3) performance of the LNA at various settings of LNA gain.

A typical integrated LNA used in prior art radio applications generally has a flat intermodulation third order intercept point IP3 performance in the AGC range of operation of the amplifier. See line 1710 of FIG. 17. The graph shows the IP3 performance 1710 of the LNA at different settings of the LNA gain. The x axis is in units of DAC steps. (Maximum gain value for the LNA is DAC step 31.) This is the DAC which sets the gain of the LNA. Thus a typical LNA in a prior art two-way radio design has flat IP3 performance across the active gain range used in the AGC system (or in this case across the DAC range). This means that the intermodulation (IM) IP3 component changes in proportion to the wanted signal as the gain in the radio is cut back or increased. Thus, if the radio is passing an IM test at one gain setting (ignoring dynamic range issues with the filter selectivity, which could limit dynamic range), the radio will continue to pass the IM test at other gain settings. The cost of this flat IM performance in prior art radios is basically running the LNA at a substantially higher current than desired in pagers and other very low current receivers. This is what is done in cellular and high end two-way land mobile products. They generally run 12 times higher current drains than used in the present invention.

The invention is optimized to run at a very low current (low power) conditions. (For example one front end IC designed according to the present invention consumes less than 450 uA where a typical cellular LNA will be greater than 5000 uA.) In the LNA topology of the present invention, the IP3 performance of the LNA 116 peaks in the AGC range of the operation. (The peaked IP3 curve is shown as curve 1720 in FIG. 17.) The best IP3 performance and therefore the best radio IMMR3 intermodulation performance was when the LNA gain setting was 18 or 17 on the AGC DAC.

With the low power LNA 116, the response of the IP3 component is not linear with reduction in gain and eventually changes direction as the gain is cut back. This creates a settling problem for the AGC system 100 which is relying on proportional decreases in power in the signal path with decreases in the LNA gain control signal. (To decrease the gain, the DAC 190 must actually be loaded with a higher value from the AGC DSP 177.)

It is typical for a very low power LNA to have a peaking IP3 in the gain range of operation. A low power LNA solution is not utilized in today's current technologies because all shipping receivers today run at much higher current drains where this effect cannot be seen. The LNA topology used in this embodiment consists of a differential amplifier which is built with two cascoded stages of transistors. If the current is cut back in the first cascode stage to turn the gain down (this corresponds in FIG. 17 to the DAC decreasing from 31 to 15), the common emitter of the first cascode transistor stage begins to saturate. This saturation effect of the first stage acts as an attenuator in front of the second cascoded stage. This attenuation of the signal improves the IP3 performance because it reduces the amount of large signal making it to the second cascode transistor stage. If the AGC digital signal processor 117 were to continue to reduce the gain the current in the transistor stages cuts back so much that current is insufficient to maintain gain and the amplifier begins to shut down. The gain of the amplifier would roll off and with little current left the IP3 would degrade as the amplifier leaves it linear region of operation.

FIGS. 18–24 do not represent the actual performance of a particular receiver. They do illustrate the issues which arise with Automatic Gain Control (AGC) in a receiver which has a Third-Order Intercept Point (IP3) which varies with gain and that does not employ the unique AGC limit of the present invention. (Specifically the IP3 performance follows the characteristic shown in FIG. 17.) In this example, the maximum gain is 18 dB, and the minimum gain is 0 dB. As AGC is applied, the IP3 peaks at around 12 dB and then declines until the gain reaches the minimum. For illustrative purposes, two large off-channel interfering signals combine to create the third-order undesirable signal at 150 MHz. The Wanted Signal has been placed at 150.5 MHz for comparison. Note how the undesired (IM) signal power varies greatly as the gain is changed, while the Wanted Signal power changes the expected 3 dB per step of the gain control value 194.

Figure 18:
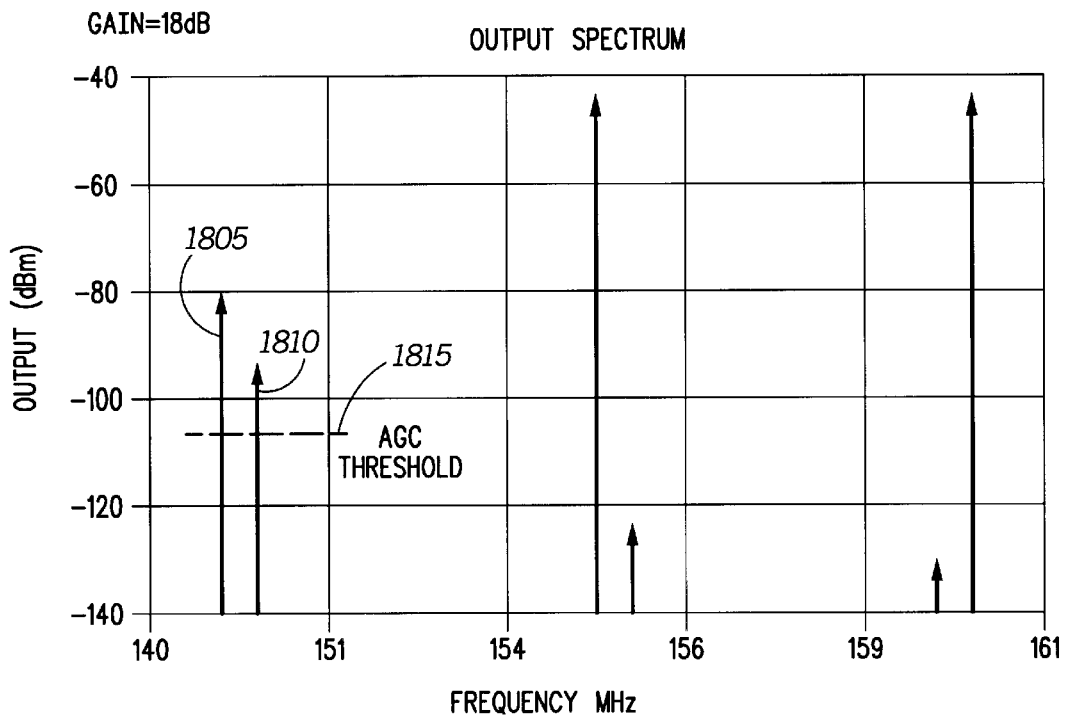
FIGS. 18–24 are charts of output spectrum of a passband of a radio in accordance with a preferred embodiment of the invention, at various LNA gains.

FIG. 18 illustrates a maximum gain in an IM environment. In FIG. 18, both the IM signal 1805 and the Wanted Signal 1810 are above the AGC threshold 1815. Therefore, the AGC system 100 will turn the gain down.

Figure 19:
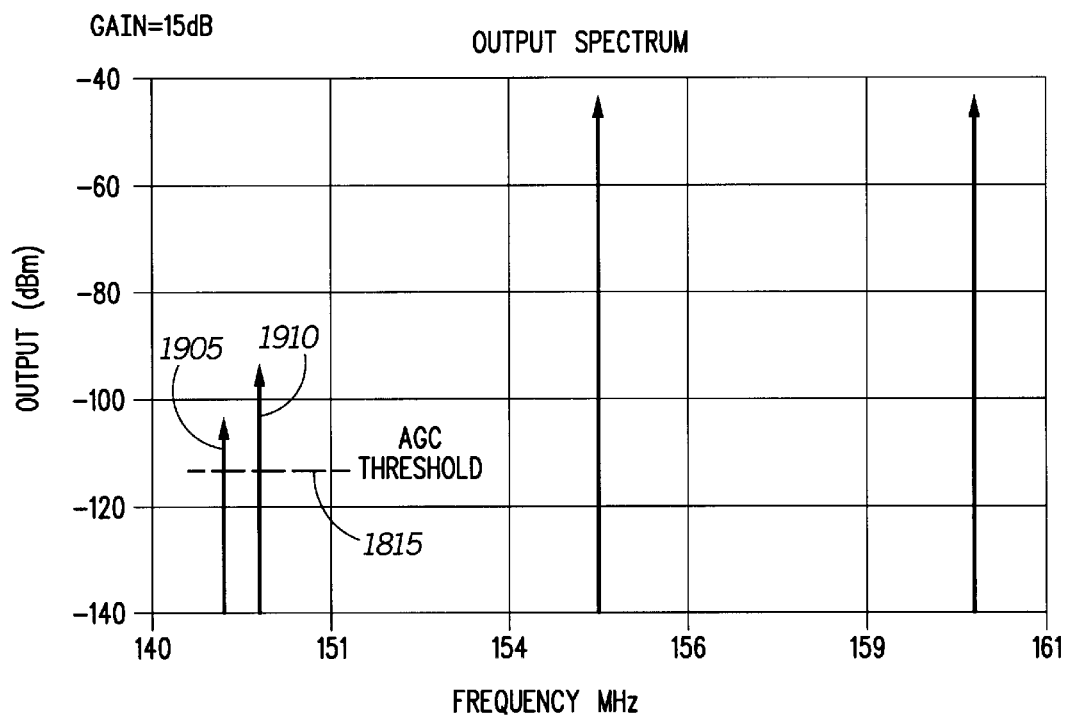

FIG. 19 illustrates the gain decreased to 15 dB. Both the IM Signal 1905 and Wanted Signal 1910 decreased. Because both signals are still above the AGC threshold the AGC system 100 will continue to decrease the gain.

Figure 20:
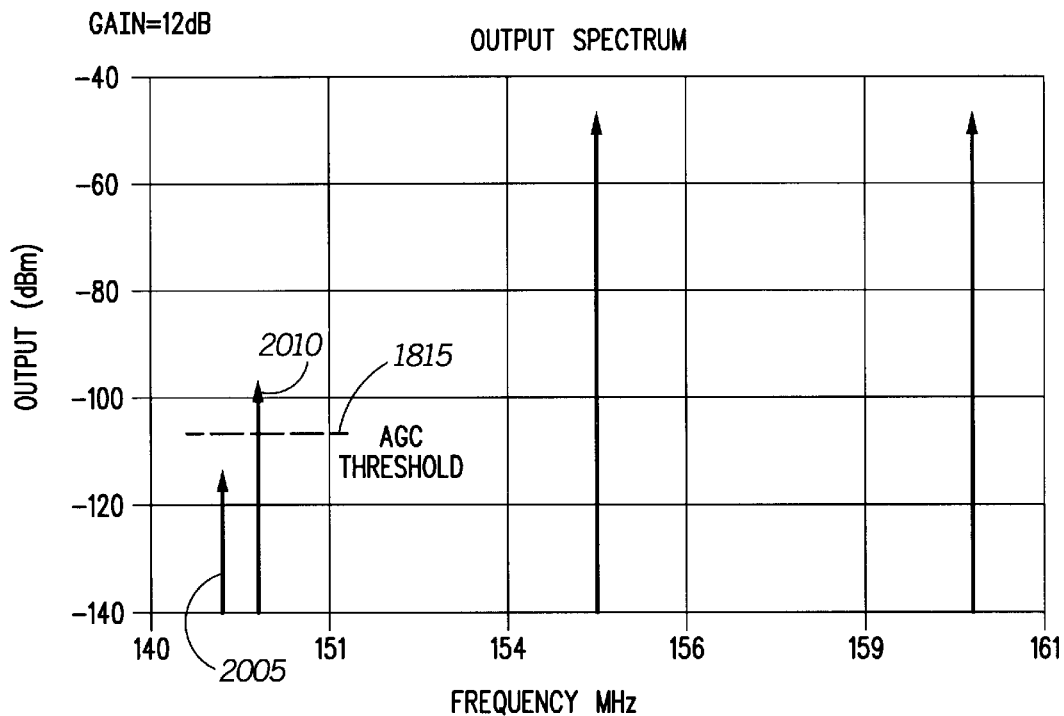

FIG. 20 illustrates the gain decreased to 12 dB. Both the IM Signal 2005 and Wanted Signal 2010 have dropped in power. The LNA is lowering the IM component because the gain is decreasing and we are approaching the peak on the IP3 curve.

Figure 21:
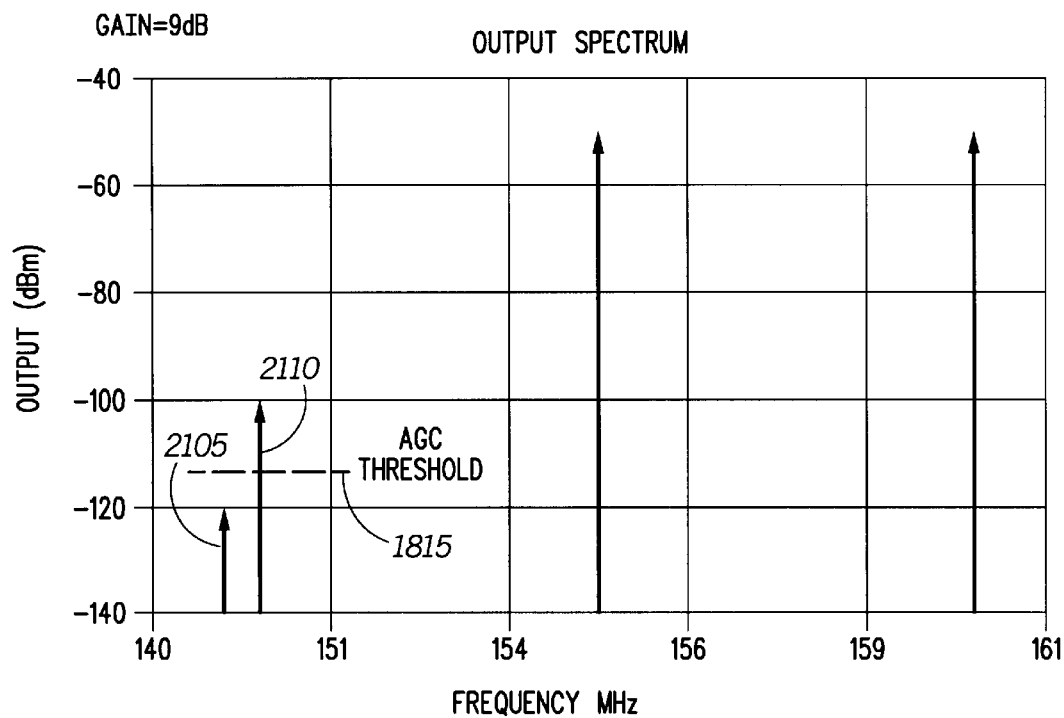

The LNA gain is decreased to 9 dB in FIG. 21. The IM and Wanted Signals 2105, 2110 both continue to decrease.

Figure 22:
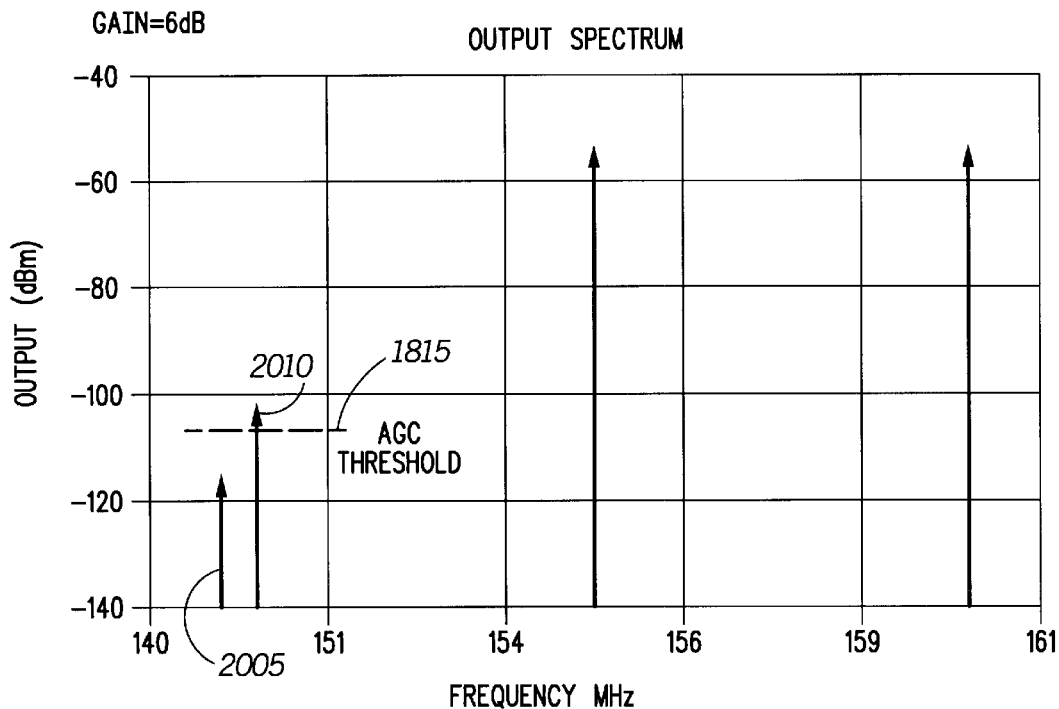

The LNA gain is decreased to 6 dB in FIG. 22 and the IM and Wanted Signals 2205, 2210 both continue to decrease. When the combined power of the wanted signal and IM signal reaches the AGC Threshold, the system will be settled and no more gain decreases will be necessary.

Figure 23:
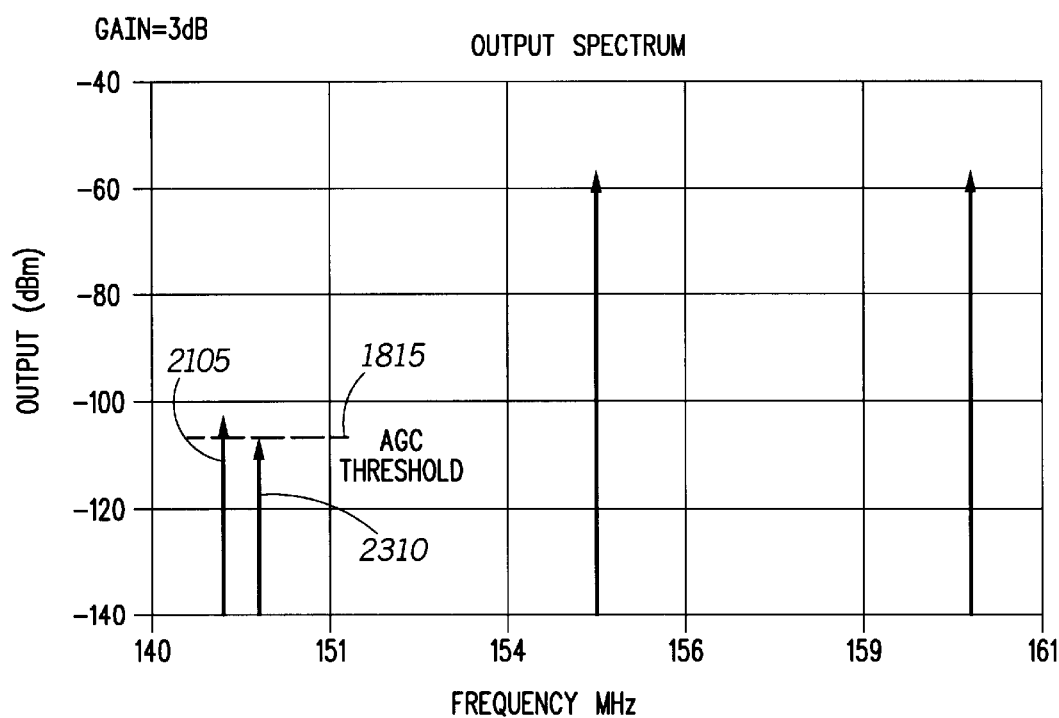

In FIG. 23 the gain has been decreased to 3 dB. The Wanted Signal 2305 decreased as expected but the IM Signal 2310 has reversed direction and has increased. This is because the LNA 116 has passed the peak on its IP3 verses gain curve and is now starting to degrade M performance. The AGC system cannot differentiate between the on channel power of the Wanted Signal and the IM Signal. Because the IM signal has risen above the AGC Threshold, the AGC system controls the LNA signal 195 to decrease its gain. The AGC system is not responding linearly to the attempted decrease of the LNA output power. If the IP3 performance was flat the AGC would have settled in this example at Gain=3 dB. As the LNA gain continues to be decreased from 3 dB, the IM Signal power in the radio which reaches the AGC digital signal processor power detector will increase, and the AGC system will ineffectively keep trying to decrease the power by decreasing the LNA gain until the LNA 116 is up against its maximum attenuation setting.

Figure 24:
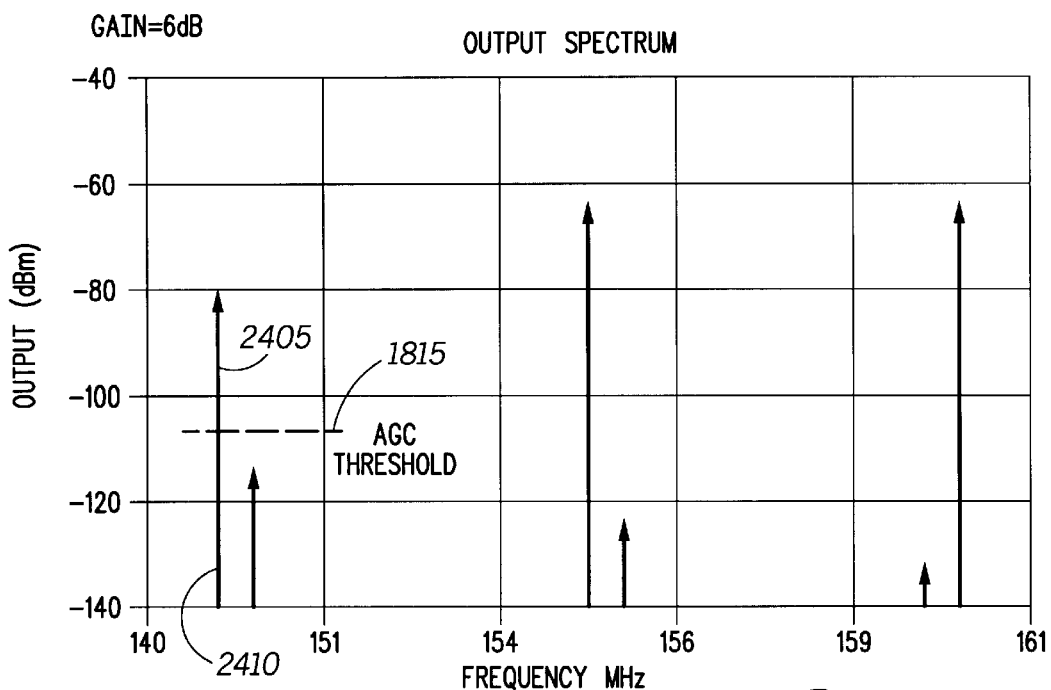

Finally as seen in FIG. 24, the AGC gain has gone all the way up against its 0 dB gain rail and the IM Signal 2405 has increased even more. This condition is not optimum for the radio Wanted Signal. At this point the gain is too low for recovering the Wanted Signal 2410. Bit Error Rate of the received signal is too high to decode a message properly from over the wireless network or radio link. (The IM signal 2405 is too strong at the detector and also interferes with the symbol decoding.)

The AGC system without the unique AGC limit feature of the present invention undesirably decreases the gain of the LNA 116 all the way to 0 dB, but because the change of strength of the IM component reversed its direction with the reduction of LNA 116 gain after the peak of the IP3 curve, a basic assumption of the AGC loop has been violated. As the loop was decreasing gain, the IM component power was increasing, and drove the AGC in a positive feedback state to rail at 0 dB gain and the AGC will stay at 0 dB gain until the IM component leaves the radio environment.

In accordance with the preferred embodiment of the present invention, the AGC system 100 limits the gain to be no less than the gain at approximately the peak of the IP3 curve of the LNA 116. This gain limit improves performance of the radio in the intermodulation environment. The closer the limit of the AGC gain adjustment is to the peak of the LNA IP3, the better the performance of the system. The LNA gain curves described with reference to FIG. 13 are shown in FIG. 25 by solid lines. The solid lines represent the gain response which would be advantageously used in the radio if the LNA had a flat IP3 response.

In accordance with the preferred embodiment of the present invention, the gain limitation is done by modifying the stored gain response at the point where the LNA gain is limited. The modified LNA gain curve is shown in the dotted line labeled "IM Optimized Curve".

Use of the modified stored gain response guarantees that, as the gain is cut back, it is limited to the value where the IP3 is the maximum for the LNA 116. This modified stored gain response is stored in the radio 1100 using the method as described with reference to FIGS. 3 and 4, but modified to have zeroes in the value adjustments for all gains below the limit An example of a modified stored gain response is shown in FIG. 25. The value adjustments are loaded for registers 1 through 8. As the AGC system 100 transverses this part of the curve it would read a calibrated value adjustment as it was decreasing gain and step down the LNA gain. This would give the radio −24 dB of gain reduction. For this example, registers 9 through 19 would be loaded with a value adjustment of zero. When the AGC system 100 was at the −24 dB gain reduction point and tried to decrease further it would only read value adjustments of 0. And thus, 0 would be added to the gain reduction pointer and the gain would not reduce (or increase).

In accordance with a first alternative embodiment of the present invention, the gain limitation is accomplished by providing a gain reduction minimum (or limit) register which, in this example, is programmed to DAC setting of 17 to limit the gain at the peak of the IP3 curve.

Figure 27:
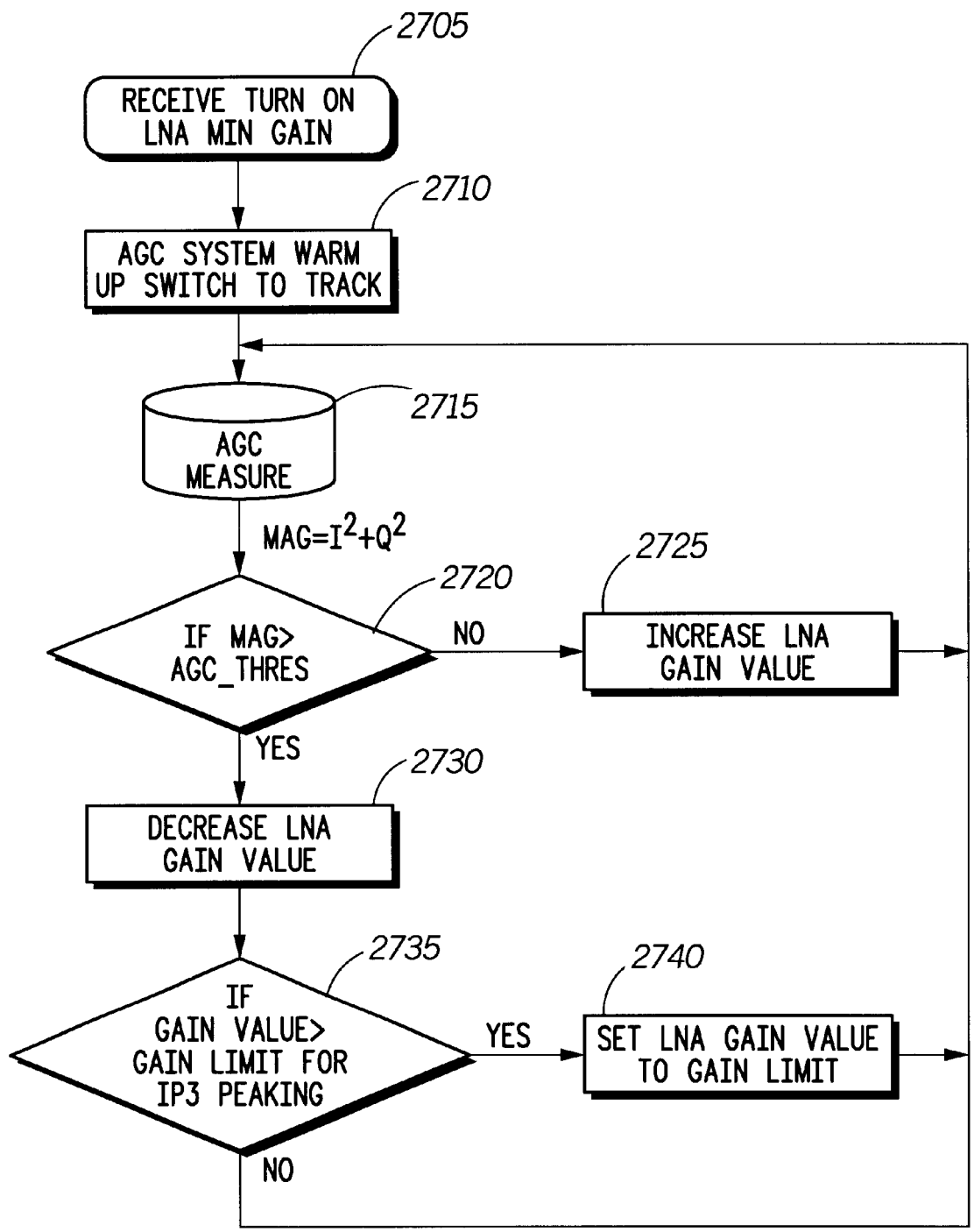
FIG. 27 is a flow diagram of a method in accordance with a first alternative preferred embodiment of the invention.

This minimum register is set to correspond with the approximately the peak of the IP3 curve and thus limit how far the AGC digital signal processor 177 would turn back the gain (the closer to the peak the cut off point is the better the performance of the radio). Referring to FIG. 27, a flow chart demonstrates the method of control which the AGC digital signal processor 177 would go through in accordance with the first alternative embodiment of the present invention. First, the radio 1100 would turn on in some minimum gain mode at step 2705. The radio 1100 would go through a warm-up sequence as previously described and switch into AGC track mode at step 2710 which is the normal mode of operation. The AGC system 100 measures and filters the magnitude of the incoming signal at step 2715. If the AGC system 100 finds that the magnitude of the detected power is below a previously set AGC Thresh (AGC threshold) at step 2720 the AGC system 100 will increase the gain of the radio 1100 at step 2725 and the loop begins again. If the AGC system 100 finds that the power of the signal which has been measured and filtered is above AGC Thresh at step 2720, it will then decrease the radio's gain value at step 2730. If the radio's gain value is below the AGC gain limit (or minimum gain), the AGC system 100 will set the radio 1100 to the gain limit at step 2740. If the gain value is not below this gain limit, it will continue a normal gain check on the radio 1100 starting at stop 2715. Thus using the AGC minimum register above is similar to using the modified stored gain response shown in FIG. 25. The increase and decrease in gain shown in FIG. 27 could be distributed in an alternative implementation between the variable gain LNA 116 and the step attenuator 114. Both devices would perform a certain amount of the gain reduction or gain increase.

Figure 28:
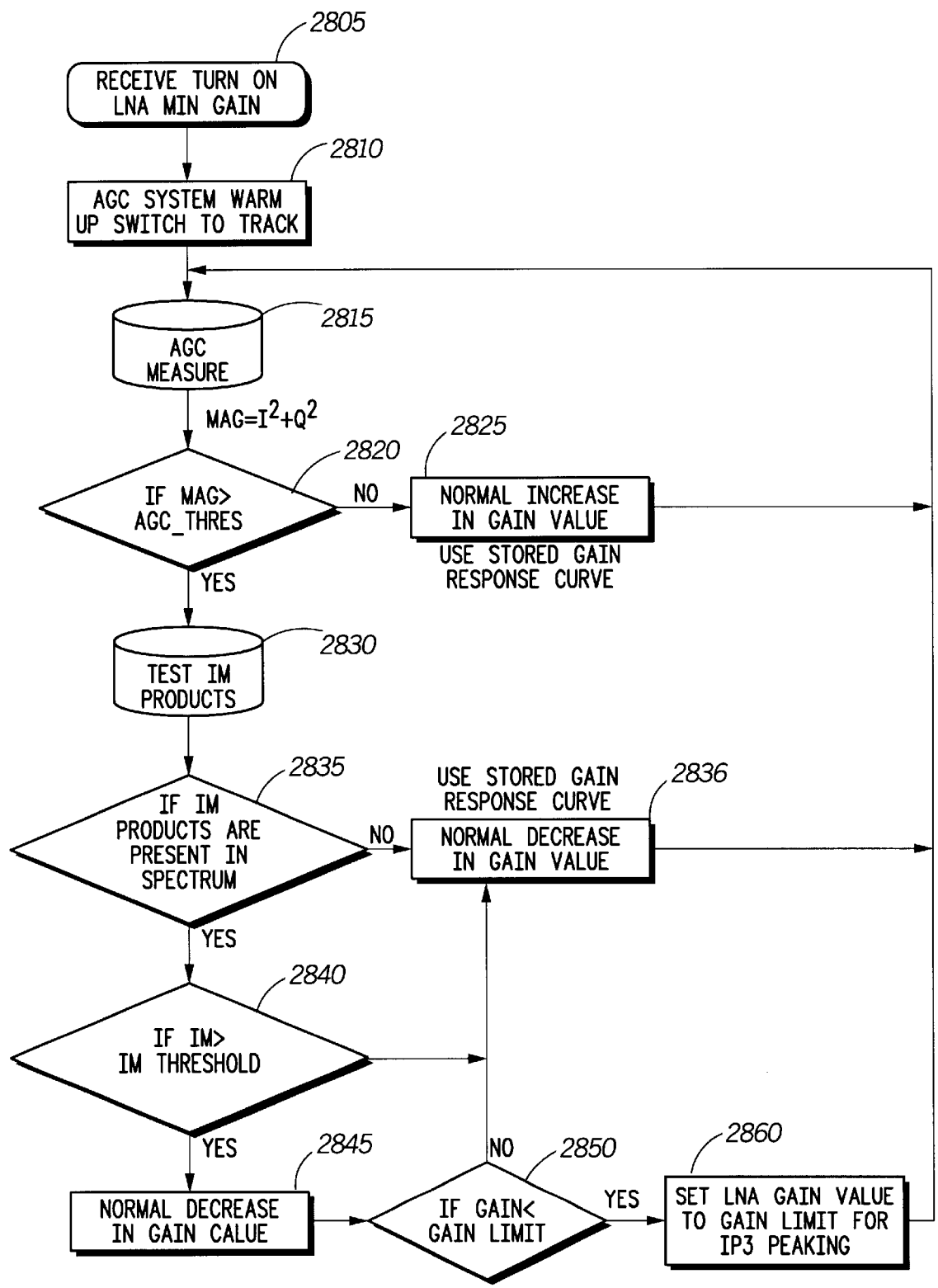
FIG. 28 is a flow diagram of a method in accordance with a second alternative preferred embodiment of the invention.

Referring to FIG. 28, a method of AGC control is shown in accordance with a second alternative embodiment of the present invention. The method uses spectral analysis to determine if AGC should be in an IP3 minimum gain setting or a normal min gain setting. First, the radio 1100 turns on in some warm up minimum gain mode at step 2805. The radio 1100 goes through a warm-up sequence as previously described and switches into an AGC track mode at step 2810 which is the normal mode of operation. The AGC system 100 measures and filters the magnitude of the incoming signal at step 2815. If the AGC system 100 finds that the magnitude of the detected power is below a previously set AGC Thresh (AGC threshold) at step 2820, the AGC system 100 increases the gain of the radio 1100 at step 2825 and the loop begins again at step 2815. If the AGC system 100 finds that the signal which has been measured and filtered is above AGC Thresh, it then tests the spectrum of the incoming signal at step 2830.

The spectrum of the incoming signal is tested by the AGC DSP 177 using spectral analysis methods known to those skilled in the art. A determination is made whether the Wanted Signal is in the presence of an IM interferer at step 2835. When the IM spectral power is above an IM threshold, and this IM interference is of such a magnitude that the combination of it and the wanted signal produce a power level greater than the AGC threshold at step 2840, the AGC system 100 then reduces the gain of the radio 1100. When the gain value is below the AGC gain limit to achieve IP3 peaking at step 2856, then the AGC system 100 will set the radio 1100 to the gain limit at step 2860. When the IM spectral power is not above the IM threshold, no gain limit is imposed; the non-modified stored gain responses are used at step 2836. The IM threshold test can be left out in an alternative implementation.

In another alternative implementation this setting of the gain limit to achieve IP3 peaking by the AGC digital signal processor 177 may be made up of several small gain change steps eventually reaching the gain limit to achieve IP3 peaking. Alternatively, these gain change steps could be in increasing or decreasing order depending on the previous setting of the AGC system 100. If the system was below the gain limit to achieve IP3 peaking, the steps would be increasing; obviously; if above, the steps would be decreasing.

In yet an another alternative implementation which used the above mentioned multi-steps to reach gain limit to achieve IP3 peaking, the AGC system 100 may re-cycle though the entire flow chart which each small gain change and in some cases the AGC system 100 may settle and stop gain adjusting because one of the other tests computes a new answer. For example, if the system where just starting to get into an IM environment and the power level was high enough to make it through the AGC threshold test, the IM spectral analysis, and the IM threshold test, the AGC system 100 may make small gain change step in the direction of gain limit to achieve IP3 peaking. This reduction or increase in gain may be enough to lower the IM component power and the AGC system 100 may immediately settle. Because now either the total power detected would not be greater than AGC threshold or the IM spectral analysis did not find the IM component or the IM component which was found did not have enough power to be over the IM power threshold test. "Settle" for the AGC system 100 means the AGC system 100 does not need to make another adjustment because the power detector has found a level that is within the AGC hysteresis window.

Referring back to FIG. 28. When IM component is detected but it does not have enough power to pass the IM component threshold test at step 2840, the AGC system 100 would do a normal gain reduction, with no minimum gain limitation imposed. When no IM components are detected at step 2835, then the AGC system 100 also does a normal gain reduction.

This brings a performance advantage to the radio 1100 because in conditions with no intermodulation distortion the normal gain reduction curve gives superior signal bit error rate performance. These conditions would be for example very strong wanted channel only or very strong simulcast environment. The normal curve does not perform well in the intermodulation environment. That is where the IM optimized curve achieves superior bit error rate performance in the intermodulation environment. Better bit error rate performance of the radio 1100 is a measure on how well the radio 1100 receives its data over the wireless network or radio link.

This invention fixes the problem with peaked IP3 response and AGC locking to the minimum gain position. First the gain characteristic of the LNA is digitized and stored in calibration registers in the digital automatic gain control section. This information is stored during a factory calibration process where a tone is fed into the radio at the factory and the gain response of the LNA is recorded into the automatic gain control memory. Then the gain point is determined for the LNA where the maximum IP3 performance exists. This point is stored in the AGC. (It can be stored by loading zeros in the calibration registers below the minimum IP3 gain point.) The AGC will now in strong signal environments limit the gain reduction up to the point which corresponds with the maximum point on the IP3 curve of the LNA. This gives the over all radio best in class intermodulation performance while still taking advantage of the low current drain LNA. The radio now will not lock to the minimum gain mode.

While the preferred embodiments of the invention have been illustrated and described, it will be clear that the invention is not so limited. Numerous modifications, changes, variations, substitutions, and equivalents will occur to those of ordinary skill in the art without departing from the spirit and scope of the present invention as defined by the following claims. The invention is applicable to FLEX, ReFLEX®, the Global System for Mobile Applications (GSM), and the Time Division Multiple Access (TDMA) protocols, and to Bluetooth™ systems.

I claim:

1. A low current drain automatic gain control system, comprising:
    a low current drain low noise amplifier (LNA) that has an intermodulation third order intercept point (IP3) that varies with a gain of the LNA such that there exists a significant peak of the IP3 between a minimum gain and a maximum gain of the LNA; and
    a gain controller that controls the gain of the LNA such that the gain is limited to a predetermined value substantially at the significant peak of the IP3, the limit being imposed between the value and one of the minimum and maximum gains.

2. The low current drain automatic gain control system according to claim 1, further comprising a stored gain response that comprises a set of gain values, each gain value being determined by an associated recovered signal power, wherein the stored gain response for a range of recovered signal powers is set to a value from which the gain controller generates the predetermined value.

3. The low current drain automatic gain control system according to claim 2, wherein the set of gain values comprises value adjustments that used by the gain controller to generate the gain values.

4. The low current drain automatic gain control system according to claim 2, further comprising a stored gain response that comprises a set of gain values, each gain value being determined by an associated recovered signal power, wherein the gain controller includes a function that imposes the predetermined value over a range of recovered signal powers irrespective of the gain values stored for the range of recovered signal powers.

5. A method used in a receiver comprising a low current drain low noise amplifier (LNA) that has an intermodulation third order intercept point (IP3) that varies with a gain of the LNA such that there exists a significant peak of the IP3 between a minimum gain and a maximum gain of the LNA, the method comprising the steps of:
    determining a signal power of a recovered signal;
    decreasing a gain value when the signal power is above a predetermined AGC threshold; and
    setting the gain value to a predetermined gain limit when the gain value is below a predetermined gain limit.

6. The method according to claim 5, further comprising the step of:
    increasing the gain value when the signal power is below the predetermined AGC threshold.

7. The method according to claim 5, wherein the gain value controls the gain of the LNA to achieve a desired gain.

8. The method according to claim 5, wherein the gain value is split to control the gain of the LNA and a gain of a step attenuator to achieve a desired total gain.

9. A method used in a receiver comprising a low current drain low noise amplifier (LNA) that has an intermodulation third order intercept point (IP3) that varies with a gain of the LNA such that there exists a significant peak of the IP3 between a minimum gain and a maximum gain of the LNA, the method comprising the steps of:
    determining a signal power of a recovered signal;
    determining a signal spectrum of the recovered signal when the signal power is above a predetermined AGC threshold;
    spectrally testing the signal spectrum for an intermodulation signal power;
    decreasing a gain value using a stored gain response; and
    setting the gain value to a predetermined gain limit when the intermodulation signal power is above a predetermined IM threshold and the gain value has been decreased below a predetermined gain limit in the step of decreasing the gain value.

10. The method according to claim 9, wherein the step of setting the gain value to a predetermined gain limit is not performed when the intermodulation signal power is below the predetermined IM threshold.

11. The method according to claim 9, further comprising the step of:

increasing the gain value when the signal power is below the predetermined AGC threshold.

12. The method according to claim 9, wherein the gain value controls the gain of the LNA to achieve a desired gain.

13. The method according to claim 9, wherein the gain value is split to control the gain of the LNA and a gain of a step attenuator to achieve a desired total gain.

* * * * *